(12) United States Patent
Kwok et al.

(10) Patent No.: US 10,667,467 B2
(45) Date of Patent: Jun. 2, 2020

(54) LIGHT CONTROL DEVICE FOR STIMULATING PLANT GROWTH AND METHOD THEREOF

(71) Applicant: Nano and Advanced Materials Institute Limited, Hong Kong (HK)

(72) Inventors: Chi Ho Kwok, Hong Kong (HK); Mei Mei Hsu, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 9 days.

(21) Appl. No.: 16/255,856

(22) Filed: Jan. 24, 2019

(65) Prior Publication Data

US 2019/0223387 A1 Jul. 25, 2019

Related U.S. Application Data

(60) Provisional application No. 62/709,600, filed on Jan. 24, 2018.

(51) Int. Cl.
*A01G 7/04* (2006.01)
*A01G 9/20* (2006.01)
*H01L 33/50* (2010.01)
*F21K 9/64* (2016.01)
*F21V 9/38* (2018.01)
(Continued)

(52) U.S. Cl.
CPC ............ *A01G 7/045* (2013.01); *A01G 9/20* (2013.01); *F21K 9/64* (2016.08); *F21S 4/28* (2016.01); *F21V 9/38* (2018.02); *F21V 9/45* (2018.02); *G02B 15/00* (2013.01); *H01L 33/502* (2013.01); *F21Y 2115/10* (2016.08)

(58) Field of Classification Search
None
See application file for complete search history.

(56) References Cited

U.S. PATENT DOCUMENTS 9,681,515 B2 6/2017 Rantala
9,750,105 B2 8/2017 Rantala
(Continued)

FOREIGN PATENT DOCUMENTS

CN 101389793 A 3/2009
CN 102606982 A 7/2012
(Continued)

*Primary Examiner* — Elmito Breval

(57) ABSTRACT

A light control device and method for stimulating plant growth is disclosed. The light control device includes a light source capable of emitting light required for plant growth. The light control device further comprises a plurality of light conversion films rotatably mounted upon a film switching unit arranged around the light source, the film switching unit driven by a motor arranged therewithin. The plurality of light conversion films may further provide a plurality of light spectra required during a plurality of plant growth stages. The light control device determines plant growth stage based on the size and the height of the plants. The motor rotates the film switching unit, based on the plant growth stage of the plants, in such a manner that a light conversion film, associated with the plant growth stage of the plants, is positioned in front of the light source. Such positioning stimulates the plant growth.

20 Claims, 21 Drawing Sheets
(4 of 21 Drawing Sheet(s) Filed in Color)

(51) Int. Cl.
*F21V 9/45* (2018.01)
*F21S 4/28* (2016.01)
*G02B 15/00* (2006.01)
*F21Y 115/10* (2016.01)

(56) References Cited

U.S. PATENT DOCUMENTS

| | | | |
|---|---|---|---|
| 9,844,116 | B2 | 12/2017 | Soler et al. |
| 2009/0288340 | A1 | 11/2009 | Hess |
| 2010/0005711 | A1* | 1/2010 | McNeff ................ C12M 21/02 47/1.4 |
| 2011/0115385 | A1* | 5/2011 | Waumans ............. A01G 7/045 315/152 |
| 2013/0326941 | A1* | 12/2013 | Pickett .................. A01G 7/045 47/1.4 |
| 2017/0006783 | A1 | 1/2017 | Aikala et al. |
| 2018/0087755 | A1 | 3/2018 | Yorio et al. |
| 2019/0110406 | A1* | 4/2019 | Adams .................. H05B 47/11 |
| 2019/0183059 | A1* | 6/2019 | Yun ........................ A01G 7/045 |
| 2020/0068810 | A1* | 3/2020 | Pahlevaninezhad ......................... H01L 25/0753 |

FOREIGN PATENT DOCUMENTS

| | | | |
|---|---|---|---|
| CN | 103408984 | A | 11/2013 |
| CN | 104197237 | A | 12/2014 |
| CN | 104776367 | A | 7/2015 |
| CN | 204513015 | U | 7/2015 |
| CN | 104966776 | A | 10/2015 |
| CN | 207230459 | U | 4/2018 |
| EP | 2834343 | A2 | 2/2015 |
| EP | 2356702 | B1 | 11/2017 |

* cited by examiner

LIGHT CONTROL DEVICE FOR STIMULATING PLANT GROWTH AND METHOD THEREOF

CROSS-REFERENCE TO RELATED APPLICATIONS AND PRIORITY

The present application claims priority from U.S. Provisional Patent Application No. 62/709,600 filed on Jan. 24, 2018, the entirety of which is incorporated herein by a reference.

TECHNICAL FIELD

The present application described herein, in general, relates to a light control device and a method for stimulating plant growth. More particularly, providing the light control device with a tunable growth spectrum.

BACKGROUND

Photosynthesis is a process of converting light energy from the sun, in which, chlorophyll in foliage absorbs sunlight to provide energy to the plants. Most plants only absorb some specific light in visible spectrum. A grow light (a kind of an electric light) is an artificial light source used to stimulate plant growth by emitting light appropriate for the photosynthesis. The grow light attempts to provide a light spectrum required for natural growth of the plants by mimicking outdoor light conditions such as color, temperature, intensity of the light. Growth cycle of each plant comprises various growth stages (e.g. germination/vegetative phase or the flowering/fruiting phase), in which, each growth stage requires a specific range of light spectrum depending on type of the plants being cultivated.

In the available grow light systems, plants are shifted from one growing rack to another growing rack based on their growth stages in order to provide the required light spectrum. Such shifting not only makes indoor cultivation complex, but also hampers the growth of the plants and increases the cost. This is because, while shifting the plants from one place to another place, the plants come into natural indoor environment which may not match with an artificial environment (mimicking the outdoor light conditions) provided by the grow light systems.

Another challenge is maintaining spectral uniformity of the available grow light systems. The spectral uniformity of the available grow light systems are poor as they use red-LED, blue-LED, white-LED as combined spectrum. Due to such combination, the light spectrum varies from one position to another position. Further, the available grow light systems provide limited growth rate and fail to generate specific nutrients. Therefore, there is long standing need of a device and a method for stimulating plant growth without shifting their positions.

SUMMARY

This summary is provided to introduce concepts related to device, method for stimulating plant growth and the concepts are further described below in the detailed description. This summary is not intended to identify essential features of the claimed subject matter nor it is intended for use in determining or limiting the scope of the claimed subject matter.

In one implementation, a light control device for stimulating plant growth is disclosed. The light control device may include a light source capable of emitting light required for plant growth. The light control device may further include a plurality of light conversion films rotatably mounted upon a film switching unit arranged around the light source. The film switching unit may be driven by a motor arranged therewithin. Further, the plurality of light conversion films may provide a plurality of light spectra required during a plurality of plant growth stages. The light control device may further include a growth monitoring unit to monitor size and height of the plants under observation. Further, the light control device may include a determining unit to determine a plant growth stage based on the size and the height of the plants. Based on the plant growth stage determined, the motor may rotate the film switching unit in such a manner that a light conversion film, associated with the plant growth stage of the plants, is positioned in front of the light source. Such positioning may enable the light emitted from the light source to pass through the light conversion film and falls on the plants with a light spectrum required for stimulating the plant growth.

In one aspect, the light conversion film may include a light conversion material and a polymer carrier.

In one aspect, the light conversion material may include quantum dots (QDs), organic/inorganic phosphors, a combination of QD and phosphors organic light conversion molecules, or inorganic light conversion complexes.

In another aspect, the light conversion material may include at least one adhesive material selected from the group consisting of silicone, modified silicone, epoxy, modified epoxy, Poly (methyl methacrylate) (PMMA), and Polycarbonate (PC).

In one aspect, the polymer carrier may include a polymer nanofiber mat or a polymer film.

In one aspect, the plurality of plant growth stages may include at least one selected from the group consisting of seeding, vegetation, flowering and fruiting.

In one aspect, the light source may include one or more light emitting diodes (LEDs). Further, the LEDs emit light spectrum with peak value in the range of 400-470 nm in order to drive the light conversion film.

In one aspect, light emitted from the light conversion film may improve growth rate of plants by 50% and/or initiate the generation of anthocyanin.

In one aspect, the light control device may further include a light guide plate to generate a planar light source. Further, the light guide plate is disposed on both sides of the light source and the light conversion film.

In one aspect, the film switching unit of the light control device may include a drum-shaped rotary film switching unit or spherical rotary film switching unit.

In another implementation, a method for stimulating plant growth is disclosed. The method may include providing a light source capable of emitting light required for plant growth. The method may further include providing a plurality of light conversion films rotatably mounted upon a film switching unit arranged around the light source. The film switching unit may be driven by a motor arranged therewithin. The plurality of light conversion films may provide a plurality of light spectra required during a plurality of plant growth stages. The method may further include monitoring, by a growth monitoring unit, size and height of the plants under observation. The method may further include determining, by a determining unit, a plant growth stage based on the size and the height of the plants. Based on the plant growth stage determined, the motor may rotate the film switching unit in such a manner that a light conversion film, associated with the plant growth stage of the plants, is positioned in front of the light source. Such positioning may enable the light emitted from the light source to pass through the light conversion film and falls on the plants with a light spectrum required for stimulating the plant growth.

In another aspect, the light conversion film may include a light conversion material and a polymer carrier.

In another aspect, the light conversion material may include quantum dots (QDs), organic/inorganic phosphors, a combination of QD and phosphors organic light conversion molecules, or inorganic light conversion complexes.

In another aspect, the light conversion material may include at least one adhesive material selected from the group consisting of silicone, modified silicone, epoxy, modified epoxy, Poly(methyl methacrylate) (PMMA), and Polycarbonate (PC).

In another aspect, the polymer carrier may include a polymer nanofiber mat or a polymer film.

In one aspect, the plurality of plant growth stages may include at least one selected from the group consisting of seeding, vegetation, flowering and fruiting.

In one aspect, the light source may include one or more light emitting diodes (LEDs). Further, the LEDs emit light spectrum with peak value in the range of 400-470 nm in order to drive the light conversion film.

In one aspect, light emitted from the light conversion film may improve growth rate of plants by 50% and/or initiate generation of anthocyanin in plants.

In one aspect, the method may further include providing a light guide plate to generate a planar light source. The light guide plate is disposed on both sides of the light source and the light conversion film.

In one aspect, the film switching unit may include a drum-shaped rotary film switching unit or spherical rotary film switching unit.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The detailed description is described with reference to the accompanying figures. Some embodiments of device and method in accordance with embodiments of the present subject matter are now described, by way of example only, and with reference to the accompanying figures.

DETAILED DESCRIPTION

Reference throughout the specification to "various embodiments," "some embodiments," "one embodiment," or "an embodiment" means that a particular feature, structure, or characteristic described in connection with the embodiment is included in at least one embodiment. Thus, appearances of the phrases "in various embodiments," "in some embodiments," "in one embodiment," or "in an embodiment" in places throughout the specification are not necessarily all referring to the same embodiment. Furthermore, the particular features, structures or characteristics may be combined in any suitable manner in one or more embodiments.

Figure 1A:
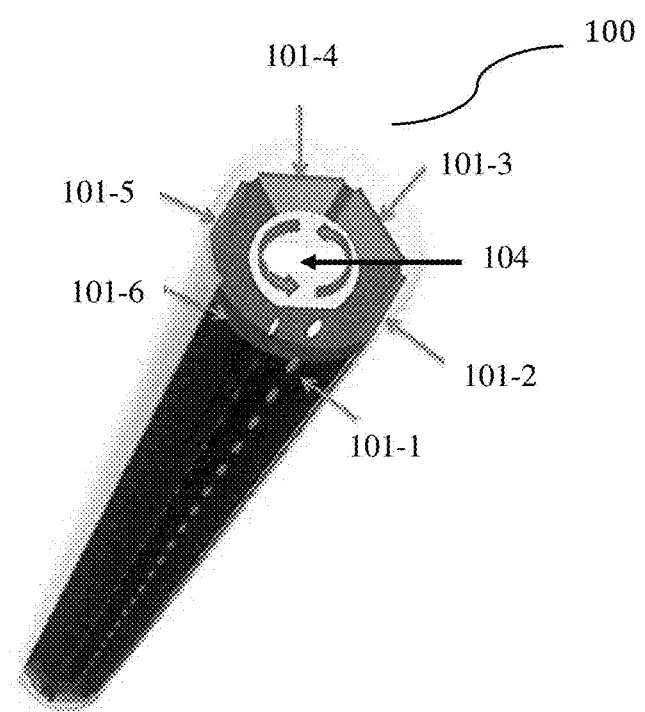
FIGS. 1a and 1b illustrate a schematic diagram of side view and cross-sectional view respectively of a light control device, in accordance with an embodiment of the present application.
Figure 1B:
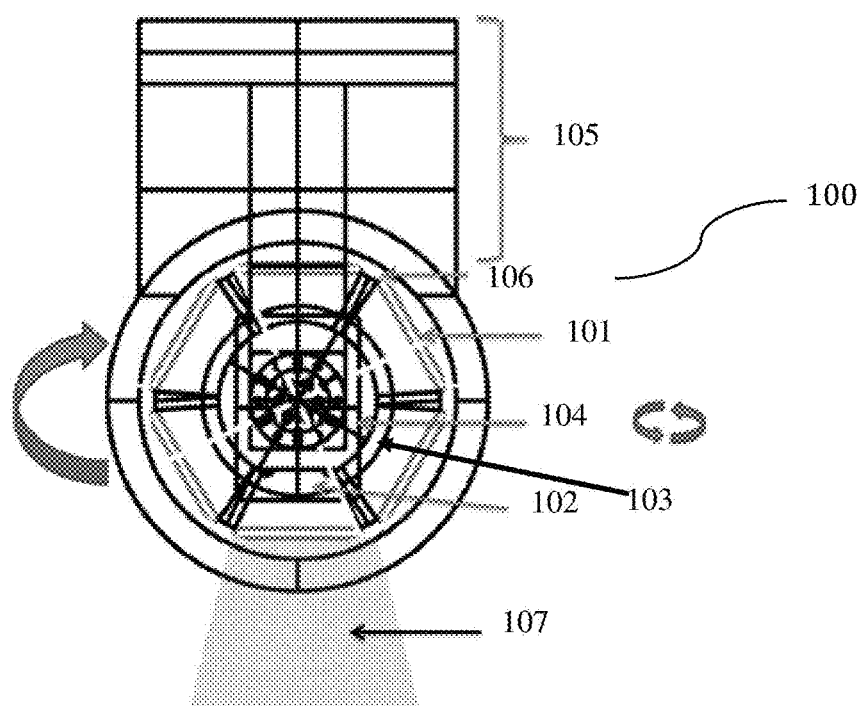
Figure 2A:
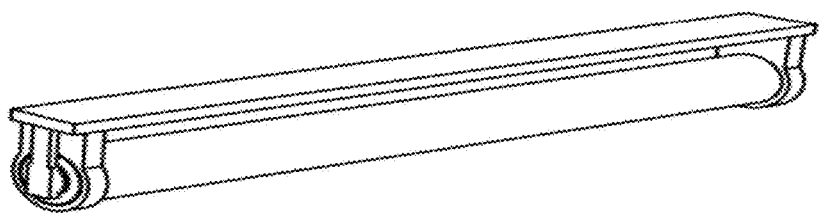
FIGS. 2a, 2b, 2c and 2d illustrate a schematic diagram of a perspective view, an axial cross-sectional view, a radial longitudinal sectional view, and an axial longitudinal sectional view respectively of an axial light control device, in accordance with an embodiment of the present application.
Figure 2B:
Figure 2C:
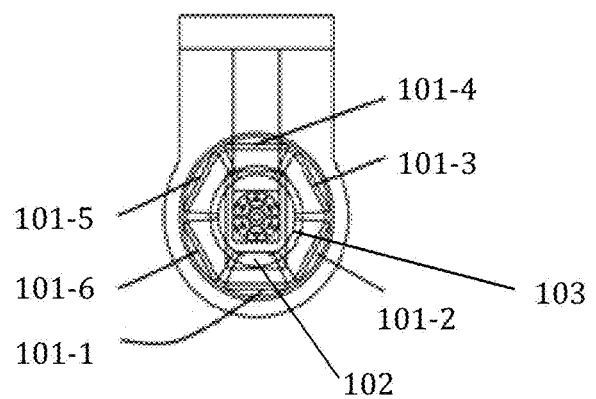
Figure 2D:
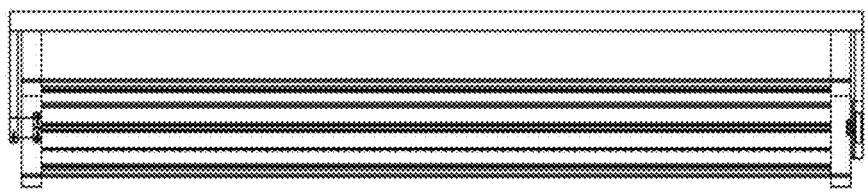
Figure 3A:
FIGS. 3a, 3b, 3c and 3d illustrate a schematic diagram of a perspective view, a left side view, a front view, and a rear view respectively of a spherical light control device, in accordance with an embodiment of the present application.
Figure 3B:
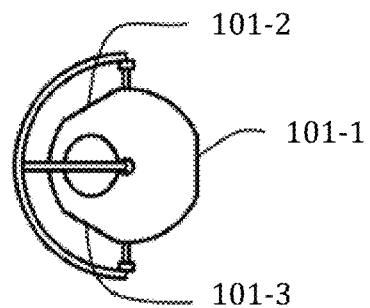
Figure 3C:
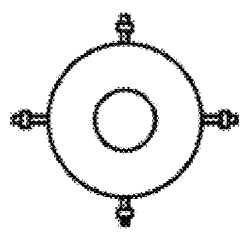
Figure 3D:
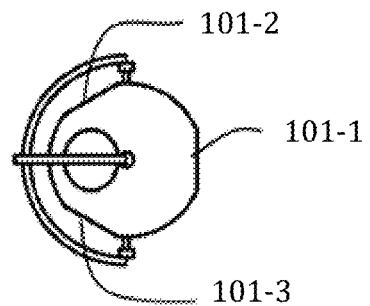

The present disclosure generally relates to a light control device for stimulating plant growth. According to embodiments of the present application, the light control device 100 for stimulating plant growth is illustrated in FIGS. 1a and 1b. The light control device 100 includes a light source 102 capable of emitting light required for plant growth. The light source 102 is supported by a light source holder 105.

According to an embodiment of the present application, the light source 102 may comprise one or more light emitting diodes (LEDs) or any other type of light emitting source.

The light control device 100 further comprises a plurality of light conversion films 101. For simplicity, only 6 light conversion films (101-1 to 101-6) have been shown in FIG. 1. However, it should be understood to the skilled person, that any number of light conversion films can be used for implementation of present application. The plurality of light conversion films 101-1 to 101-6 are rotatably mounted upon a film switching unit 103 arranged around the light source 102. The plurality of light conversion films 101-1 to 101-6 are mounted upon the film switching unit 103 in a conventional manner, for example, by attachment or mounted by card slot. When the light conversion film 101 is manually switched, only the light conversion film is needed to be taken out from the film switching unit 103.

Preferably, the film switching unit 103 is a rotary film switching unit capable of being driven by a motor 104 arranged therewithin. The light conversion films 101-1 to 101-6 are evenly or unevenly distributed on the surface of the film switching unit 103, so that, by rotating the film switching unit 103, the light conversion film 101 can be switched to get desired light spectrum. The rotary film switching unit 103 can be rotated in any direction, for example, in one direction or in two directions. According to an embodiment of the present application, the rotary film switching unit 103 is a drum-shaped rotary film switching unit 103 that is rotatable in the axial direction. According to another embodiment of the present application, the rotary film switching unit 103 is a spherical rotary film switching unit that is rotatable in an axial or radial direction.

The plurality of light conversion films 101-1 to 101-6 provide a plurality of light spectra required during a plurality of plant growth stages. The number of the light conversion films 101 can be selected according to the size and type of the light source 102. According to an embodiment, the light control device 100 comprises at least 4 light conversion films 101 for different growth stages of the plants, including but not limited to the following stages: 1) seeding, 2) vegetation, 3) flowering, and 4) fruiting. The light conversion film 101 used in the present application is explained in detail in subsequent paragraphs of the specification.

According to an embodiment of the present application, the light conversion film 101 comprises a light conversion material and a polymer carrier. The light conversion material may include, but not limited to, quantum dots, inorganic phosphors, or a combination thereof. Whereas, the polymer carrier may comprise a polymer nanofiber mat or a polymer film. The polymer material used as the polymer carrier has a refractive index of 1.45 or more. The weight of the light conversion material is 0.3% to 11% by weight of the polymer carrier.

According to an embodiment of the present application, the quantum dot has an emission wavelength of preferably 500-750 nm. Examples of quantum dots are, but not limited to, Carbon QDs, Perovskite QDs (MAPbBr$_3$, CsPbX$_3$, X=Cl, Br and I), CdSe/ZnS or InP/ZnS based Core-Shell/Core-shell-shell based QDs. The quantum dots are suitably red quantum dots and/or green quantum dots. According to an embodiment of the present application, the red quantum dots particularly refer to quantum dot materials having an emission wavelength of 600-660 nm, including but not limited to: 1) main core quantum dot, such as CdSe, CdTe, CdSe$_x$Te$_{1-x}$, InP, InP$_x$As$_{1-x}$, CuInS$_2$; 2) core-shell structure coated modified material with the above materials as the core, such as CdSe/CdS, CdTe/CdS, CdTe/CdS/ZnS, CuInS$_2$/ZnS, CdSe/CdS/ZnS; and 3) gradient alloy quantum dots such as GA_CdSe/ZnS, GA_InP/ZnS. Whereas, the green quantum dots particularly refer to quantum dot materials having an emission wavelength of 500-560 nm, including but not limited to: 1) main core quantum dot, such as Cd$_x$Zn$_{1-x}$Se, Cd$_x$Zn$_{1-x}$Te, CdSe$_x$S$_{1-x}$, InP; 2) core-shell structure coated modified material with the above materials as the core, such as CdSe/ZnS, Cd$_x$Zn$_{1-x}$Se/ZnS/ZnO, CdTe/ZnS, InP/ZnS, CdSe/ZnS/ZnO; and 3) gradient alloy quantum dots such as GA_CdSe/ZnS, GA_InP/ZnS. The size of the quantum dots is suitably 2-15 nm, and preferably 2-10 nm.

According to embodiments of the present application, the inorganic phosphor has an emission wavelength of preferably 500-750 nm.

The inorganic phosphor is suitably a red inorganic phosphor and/or a green inorganic phosphor. According to embodiments of the present application, the red inorganic phosphor specifically refers to an inorganic fluorescent material having an emission wavelength of 600-660 nm, including but not limited to: 1) oxides such as ZnO:Zn, SnO$_2$:Eu, Y$_2$O$_3$:Eu; 2) sulfides such as ZnS:Cu; and 3) rare earth compounds, such as rare earth sulfur oxide systems, rare earth pomegranate systems, and rare earth doped compounds. According to embodiments of the present application, the green inorganic phosphor specifically refers to an inorganic fluorescent material having an emission wavelength of 500-560 nm, including but not limited to: SrGa$_2$S$_4$:Eu, Y$_3$Al$_5$O$_{12}$:Ce, Gd$_3$Al$_5$O$_{12}$:Ce, La(PO$_4$):Ce,Tb, (Ce,Tb)MgAl$_{11}$O$_{19}$, (Gd,Ce,Tb)MgB$_5$O$_{10}$, CaY$_2$Al$_4$SiO$_{12}$:Ce, Ca$_3$(PO$_4$)$_2$.CaF$_2$:Ce,Mn, CaAlSiN$_3$:Eu, (Sr,Mg)$_3$(PO$_4$)$_2$:Sn, Mg$_4$(F)GeO$_6$:Mn, Mg$_5$As$_2$O$_{11}$:Mn, Sr$_5$(PO$_4$)$_3$Cl:Eu, Sr$_6$P$_5$BO$_{20}$:Eu, (Ba,Ti)$_2$P$_2$O$_7$:T.

When the light conversion material is quantum dot, the weight of the light conversion material may be as low as 0.3% by weight of the polymer carrier, for example, as low as 0.335%, as low as 0.4%, as low as 0.5%, as low as 0.6%, as low as 0.7%, as low as 0.8%, as low as 0.9%, and as low as 1%. When the light conversion material is an inorganic phosphor, the weight of the light conversion material may be 5%-11%, for example, 10.3% by weight of the polymer carrier. When the light conversion material is a composite of quantum dots and inorganic phosphors, the weight of the light conversion material may be from 0.3% to 11% by weight of the polymer carrier.

According to an embodiment of the present application, the light conversion material is a composite of a quantum dot and an inorganic phosphor, and the compound ratio of the quantum dot and the inorganic phosphor in the composite is adjusted according to different growth stages of the plant, for example, but not limited to, a compound ratio of 1:3000 for plant growth stage, and a compound ratio of 1:1 for plant flowering and fruiting stages.

According to embodiments of the present application, the nanofiber mat is generally prepared by electrospinning a polymer, and the electrospinning method can adopt a solution electrospinning method conventionally used in the art, that is, selecting a suitable solvent to dissolve the polymer into a solution having a certain concentration and viscosity, and then performing electrospinning, wherein the host polymer material used in the solution electrospinning may be a polymer material conventionally used in the art, including but not limited to the following materials: Nylon 6.6, Polyurethanes (PU), Polybenzimidazole (PBI), Polycarboate (PC), Polyacrylonitrile (PAN), Polymethacrylate (PMMA), Polyaniline (PANI), Polystyrene (PS), Polyethylene Terephtalate (PET), Poly(vinylidene fluoride) (PVDF), Polyvinylidene fluoride (PVF), Polyvinylchloride (PVC), poly(9-vinylcarbazole) (PVK), polyvinylacetate (PVAc), and combinations thereof. The nanofiber mat light conversion film of the present application can have a thickness of as low as 15 μm. Since the structure of the nanofiber mat brings light diffusion, no diffusion powder is needed, thereby saving cost and achieving high strength and flexibility for wider use.

According to an embodiment of the present application, the polymer film comprises a heat-curable polymer film or a UV-curable polymer film. The curing temperature of the heat-curable polymer film is preferably 80-110° C. The curing time is not particularly limited, for example, 3-10 min, or 5 min. The host polymer material of the polymer film is polymer materials conventionally used in the art including, but not limited to, the following materials: epoxy resin, acrylic resin, acrylic modified epoxy resin, silicone resin, acrylic modified polyurethane, urethane, and combinations thereof. The polymer light conversion film of the present application may have a thickness of 100-160 μm, for example, 150 μm. Although it is thicker than the nanofiber mat light conversion film, it has better water-insulating and heat insulating properties.

According to an embodiment of the present application, the polymer material used as the carrier has a refractive index of 1.45 or more, preferably 1.5 or more, for example, 1.55, so as to improve light utilization and promote plant growth efficiency. In one embodiment of the present application, the refractive index of the polymer material is 1.45, and the emission brightness of the light conversion film is 13.46 cd/m$^2$. In another embodiment of the present application, the refractive index of the polymer material is 1.55, and the emission brightness of the light conversion film is up to 25.67 cd/m$^2$.

In another embodiment of the present application, the light conversion film 101 comprises the light conversion material, the polymer carrier, and a protective isolation film disposed on one surface or on both upper and lower surfaces of the light conversion film.

The protective isolation film (not shown in the Figure) may be disposed on one surface or upper and lower surfaces of the light conversion film 101 in order to maintain better stability of the light conversion film 101 in high temperature and high humidity environment. The material of the protective isolation film is a protective isolation film material conventionally used in the art including, but not limited to, the following materials: Polyethylene terephthalate (PET), polypropylene (PP), polyethylene (PE) and the like. The thickness of the protective isolation film is not particularly limited.

According to an embodiment of present application, optionally, a diffusion film (not shown in the Figures) may be disposed in front of the light conversion film 101 in order to make the light more uniform and to eliminate spots and other light-emitting problems. Here, the term "front" is relative to the light emitting surface of the light conversion film 101. The material of the diffusion film is a diffusion film material conventionally used in the art, including but not limited to polyethylene terephthalate (PET), polymethacrylate (PMMA), epoxy resin, and the like.

A method of preparing the above described light conversion film 101 is disclosed, in accordance with an embodiment of the present application. The preparation method can be carried out according to a conventional method in the art, for example, but not limited to, mixing the light conversion material and the polymer to form a luminescent composite, and then coating or buffing the obtained luminescent composite onto a substrate, and forming a film by heat curing or UV curing; or coating, spraying or dip coating the light conversion material on the polymer nanofiber mat, and then drying at a low temperature. The substrate may be a substrate conventionally used in the art, such as PET, PP, PE or other polymer-based materials, as long as it can serve as a film-forming carrier. The temperature of the heat curing is preferably from 80-110° C. The curing time of the heat curing or the UV curing is not particularly limited, and may be, for example, 1-10 mins, such as 2 mins. The low temperature drying generally refers to drying below 50° C., for example, 20-40° C. The time of the low-temperature drying is not particularly limited, and may be, for example, 5-30 mins, such as 15 mins. The light conversion material is generally used in the form of a solution to facilitate coating, molding, spraying, and dip coating operations. The solution concentration of the light conversion material is not particularly limited as long as the mixture of the light conversion material and the polymer can form a substantially continuous film on the substrate, or the light conversion material can be uniformly attached to the polymer nanofiber mat. The method of preparing the above described light conversion film 101 is explained here below with few examples.

Example 1

Figure 8:
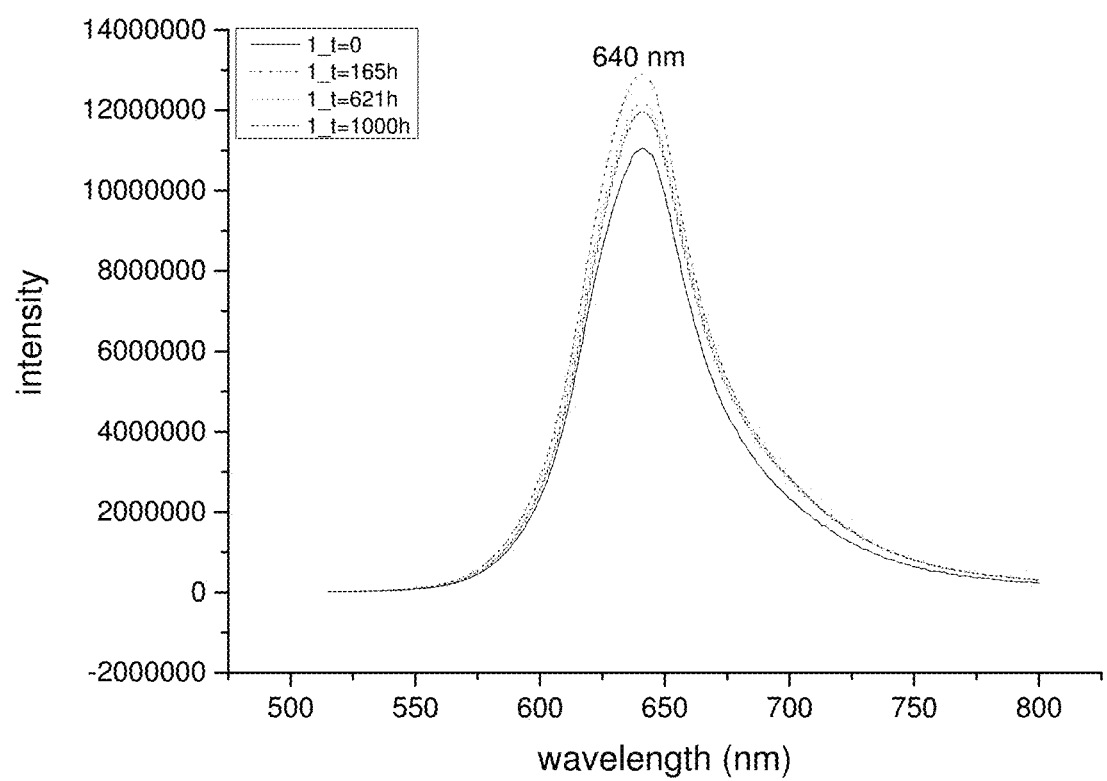
FIG. 8 illustrates intensity vs wavelengths graph of the light conversion film when baked at temperature of 40° C. for 0 hour, 165 hours, 621 hours and 1000 hours, in accordance with Example 1 of the present application.

A light conversion film 101 comprises the light conversion material and the polymer film as the carrier, wherein the light conversion material is a composite of quantum dots and inorganic phosphors, and the polymer film is prepared from SYLGARD® 184 silicone resin with a refractive index of 1.5±0.1. The light conversion film is prepared as follows: 3 ml of CdSe/CdS red quantum dot solution (dissolved in chloroform, 10 mg/mL) and 1 g of red inorganic phosphor are uniformly mixed. The resulting mixed solution is further mixed with 10 g of SYLGARD® 184 silicone resin to form a luminescent composite, which was then coated on a PET substrate and thermally cured (80° C., 5 minutes). The light conversion film of the present application has excellent stability and can work normally in a high temperature and high humidity environment. The light conversion film of Example 1 of the present application is baked at a temperature of 40° C. for 1000 hours. Now referring to FIG. 8, an intensity vs wavelengths graph of the light conversion film when baked at 0 hour, 165 hours, 621 hours and 1000 hours is illustrated, in accordance with the example 1 of the present application. It can be observed from the graph shown in FIG. 8 that, the intensity/brightness of light conversion film does not change significantly and tends to be stable.

Example 2

The light conversion film 101 comprises the light conversion material, the polymer film as the carrier, and upper and lower protective isolation films, wherein the light conversion material is a composite quantum dot, and the polymer is a UV curing glue having a refractive index of 1.48. The light conversion film is prepared as follows: 0.89 ml of a GA_InP/ZnS green quantum dot solution (dissolved in chloroform, 10 mg/mL) and 0.1189 ml of a CdSe/CdS red quantum dot solution (dissolved in chloroform, 10 mg/mL) are uniformly mixed. The obtained quantum dot solution and 2 g of UV-curable glue are mixed to form a luminescent composite, which is then coated on a PET protective isolation film, formed by a film molding, and UV curing, and then, the periphery of the light conversion film is packaged. The light conversion film of Example 2 of the present application is baked at a temperature of 85° C. for 500 hours.

Figure 9A:
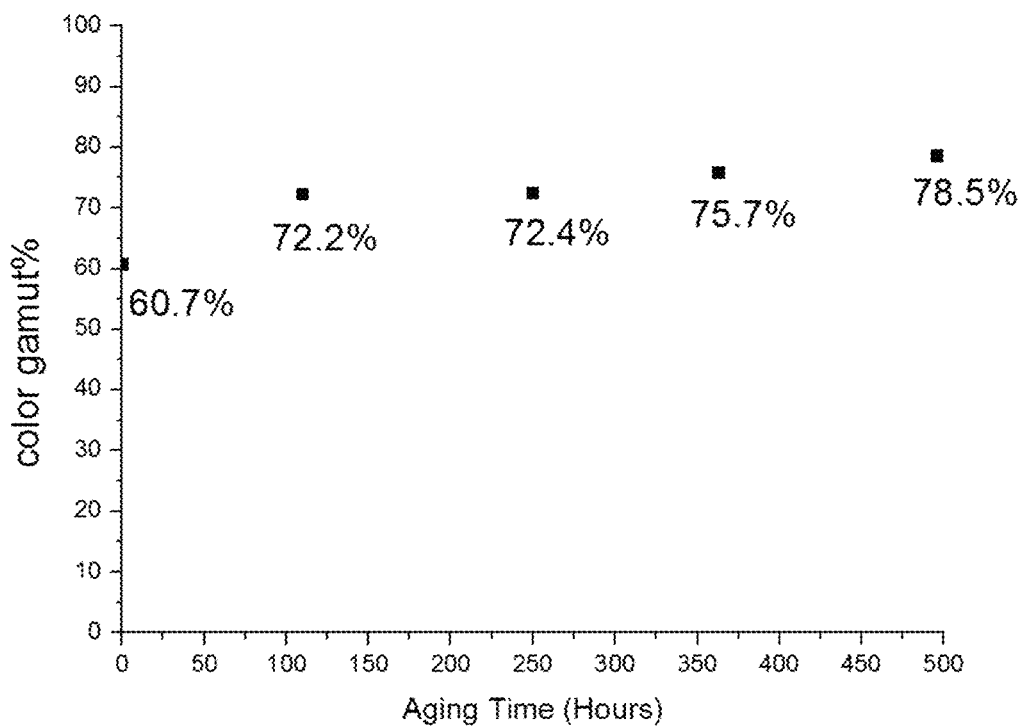
FIGS. 9a and 9b illustrate respectively a color gamut (%) vs aging time (hours) graph and a luminance ($cd/m^2$) vs aging time (hours) graph of the light conversion film when baked at a temperature of 85° C. for 0 hour, 100 hours, 250 hours, 350 hours, 500 hours, in accordance with Example 2 of the present application.
Figure 9B:
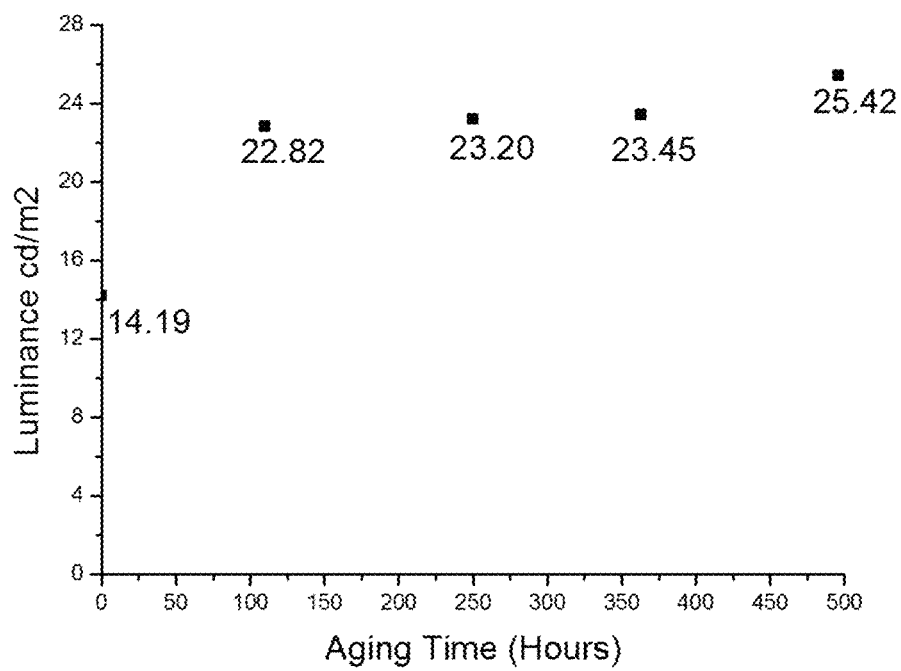

Now referring to FIGS. 9a and 9b, color gamut (%) vs aging time (hours) graph and luminance (cd/m$^2$) vs aging time (hours) graph of the light conversion film when baked at a temperature of 85° C. for 0 hour, 100 hours, 250 hours, 350 hours, and 500 hours is illustrated in accordance with Example 2 of the present application. It can be observed from the graphs shown in FIGS. 9a and 9b that the color gamut and luminance of light conversion film is not decreased and is stable. Further the brightness/luminance and color gamut of the light conversion film without the protective film both dropped by 50%.

Figure 10:
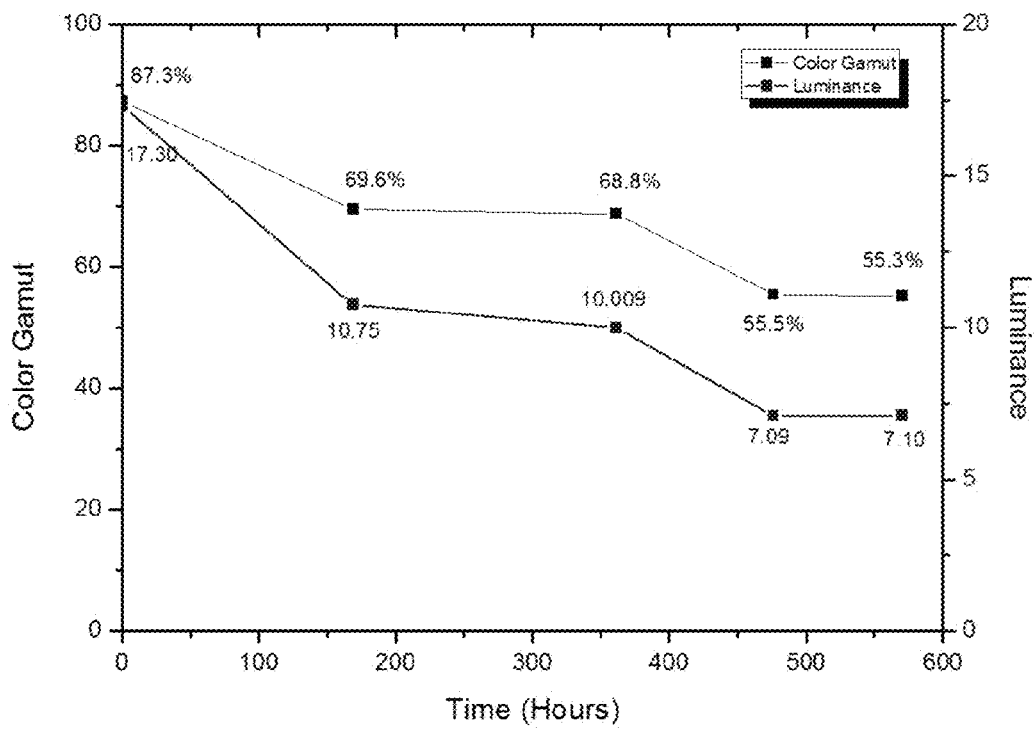
FIG. 10 illustrates a color gamut and luminance vs time graph of the light conversion film tested at a temperature of 65° C. and at 95% humidity, in accordance with Example 2 of the present application.

The light conversion film as explained above with Example 2 of the present application is also tested at temperature of 65° C. and 95% humidity for 500 hours. Now referring to FIG. 10, color gamut and luminance vs time graph of the light conversion film tested at temperature of 65° C. and 95% humidity is illustrated, in accordance with example 2 of the present application. It can be observed from the graph that, after 500 hours test, the brightness of the light conversion film is decreased by 12%, and the color gamut is decreased by 15% and showed a stable trend.

Example 3

The light conversion film comprises the light conversion material, the polymer nanofiber mat as the carrier, and upper and lower protective isolation films, wherein, the light conversion material is a composite quantum dot, and the polymer nanofiber mat is polyvinylidene fluoride with a refractive index of 1.42. The preparation method of the light conversion film is as follows: 0.89 ml of a GA_InP/ZnS green quantum dot solution (dissolved in chloroform, 10 mg/mL) and 0.1189 g of a CdSe/CdS red quantum dot solution (dissolved in chloroform, 10 mg/mL) are uniformly mixed; the obtained quantum dot solution is coated, sprayed, or dip coated on a 20×40 mm polyvinylidene fluoride nanofiber mat, and then dried at a low temperature (40° C., 15 min); the nanofiber light emitting layer is sealed between the PP protective isolation film using a thermosetting sealant.

Example 4

Figure 13A:
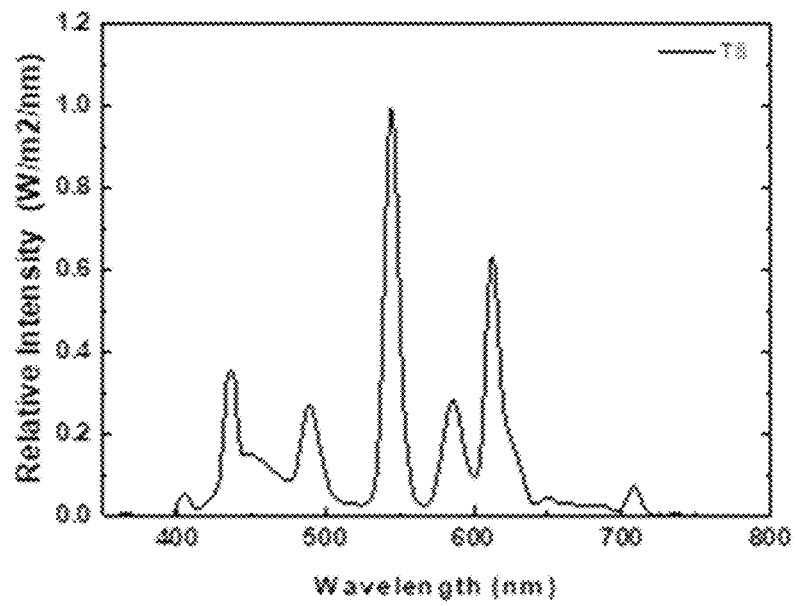
FIGS. 13a, 13b, 13c and 13d illustrate respectively a reference spectrum of Philips™ T8 grow light, a spectrum-1, a spectrum-2, and a spectrum-3 of the light control device, in accordance with an embodiment of the present application.
Figure 13B:
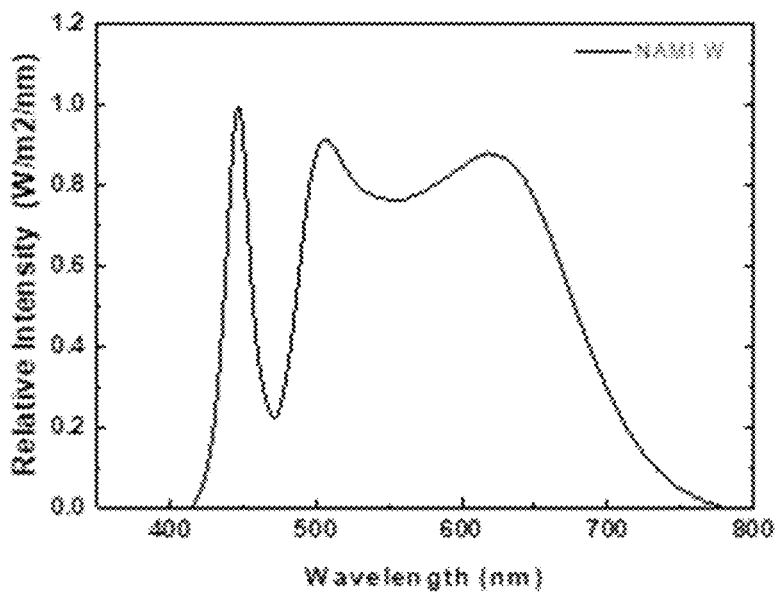
Figure 13C:
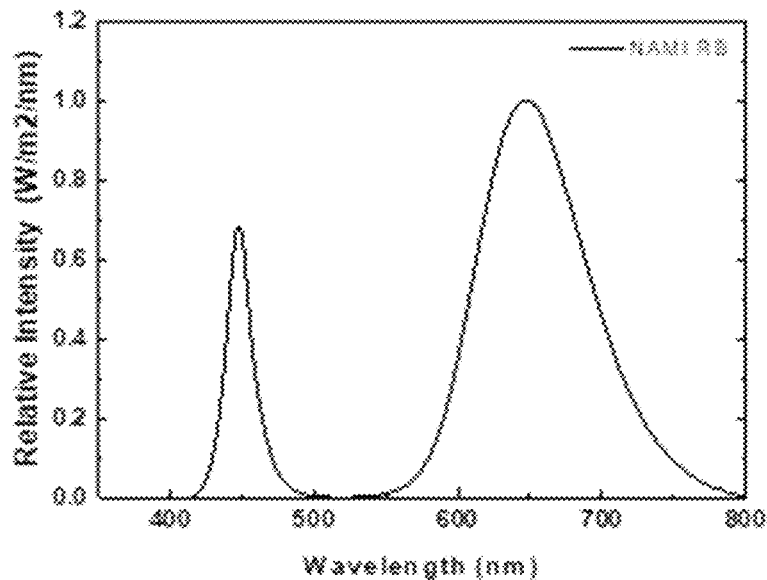
Figure 13D:
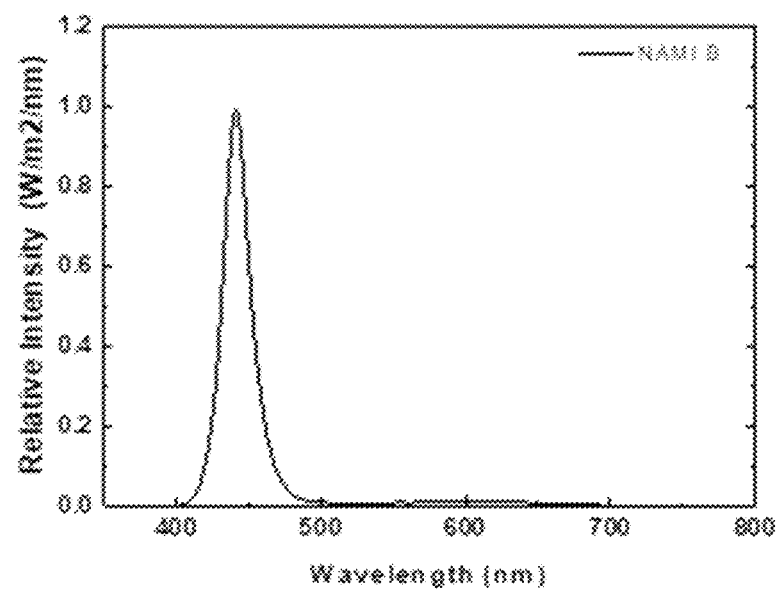

The light conversion films of Spectrum-1 and Spectrum-2 comprises the light conversion material and the polymer film as the carrier, wherein the light conversion material is a composite of inorganic phosphors, and the polymer film is prepared from SYLGARD® 184 silicone resin with a refractive index of 1.5±0.1. The light conversion film of Spectrum-1 is prepared as follows: 0.67 g of cyan inorganic phosphor, 1.10 g of yellow inorganic phosphor and 0.22 g of red inorganic phosphor is uniformly mixed with 10 g of SYLGARD® 184 silicone resin to form a luminescent composite, which was then coated on a PET substrate and thermally cured (80° C., 5 minutes). While the light conversion films of Spectrum-2 is prepared as follows: 1.3 g of red inorganic phosphor is mixed with 10 g of SYLGARD® 184 silicone resin to form a luminescent composite, which was then coated on a PET substrate and thermally cured with the final thickness of 560 nm (80° C., 5 minutes). The light conversion films of Spectrum-1 and Spectrum-2 can be referred to the emission spectrum of FIGS. 13b and 13c respectively which are excited by 450 nm LED.

Further, the shape of the light conversion film 101 may be of different shape, for example a strip shape or a circular shape. The light conversion film 101 may be molded into different shapes to change the emission angle and light shape. The light conversion film 101 can also be molded into different shapes by using a micro-imprint technique to change the emission angle and light shape to avoid harming the operator's eyes while making the light more uniform.

According to an embodiments of the present application, the setting angle of the light conversion film 101 generally needs to consider the following two situations: 1) the light conversion film 101 itself has an optical effect layer (with an optical coating or pattern), and needs to be used according to a specified setting direction; and 2) the light conversion film 101 has no optical effect layer, and there is no need to specially set the angle of the light conversion film 101.

Figure 7A:
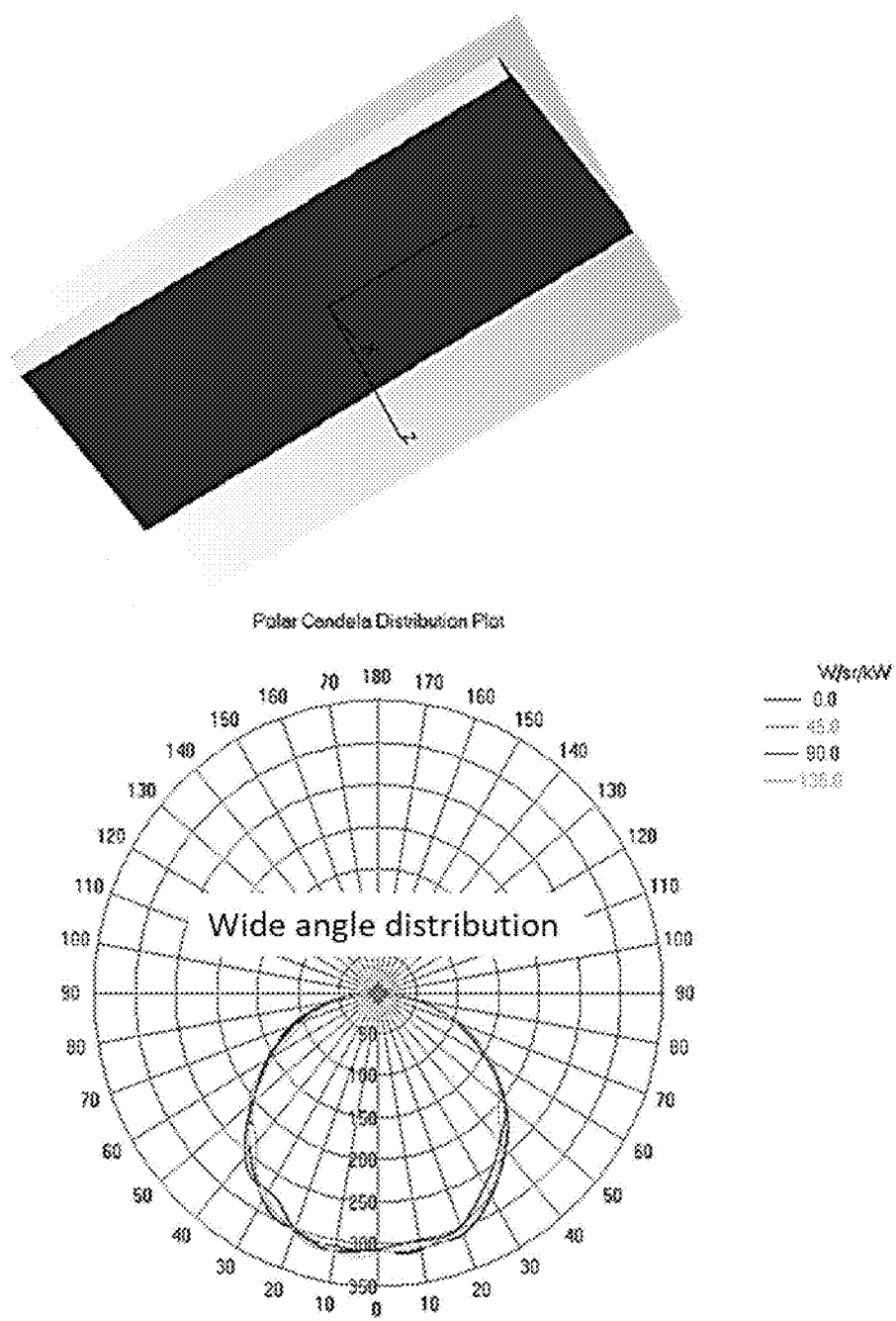
FIGS. 7a, 7b, 7c, 7d and 7e illustrate different shapes of the light conversion film with change in an emission angle and light shape, in accordance with an embodiment of the present application.
Figure 7B:
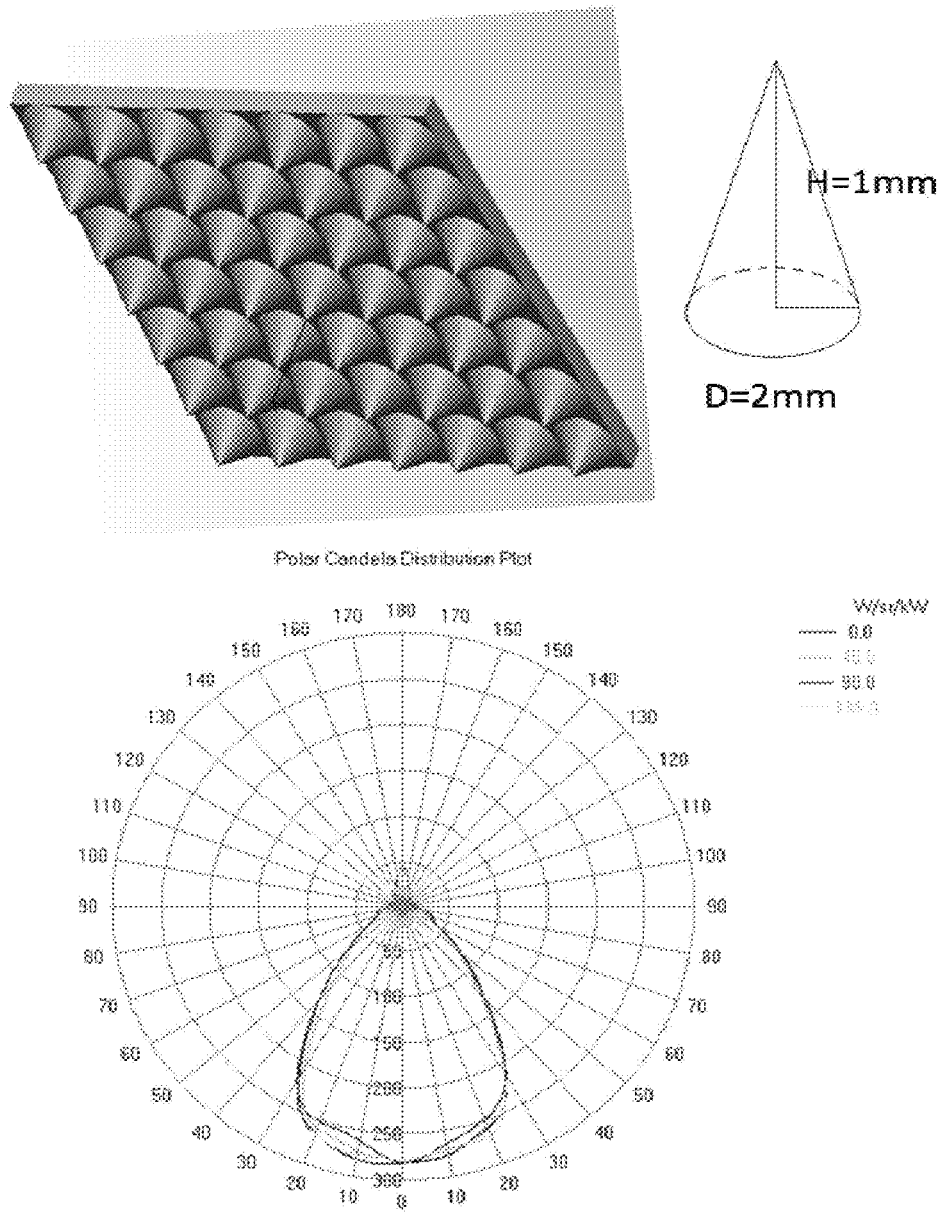
Figure 7C:
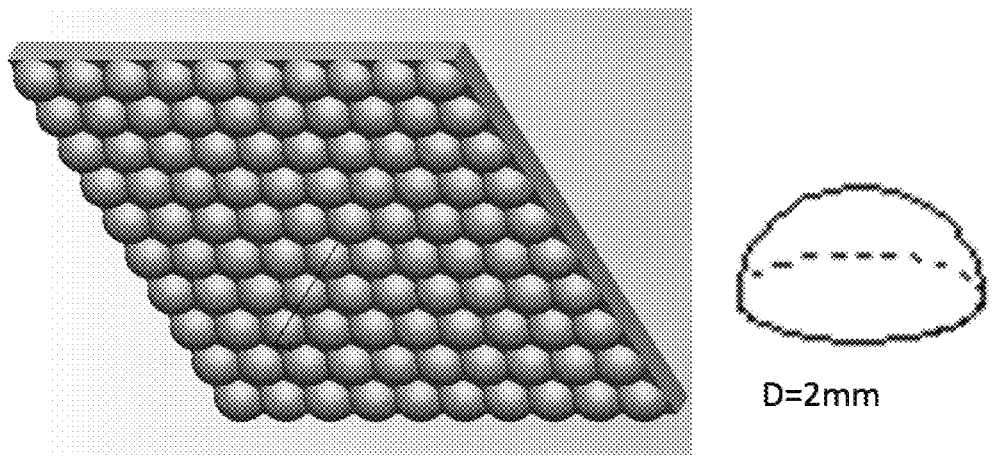
Figure 7C:
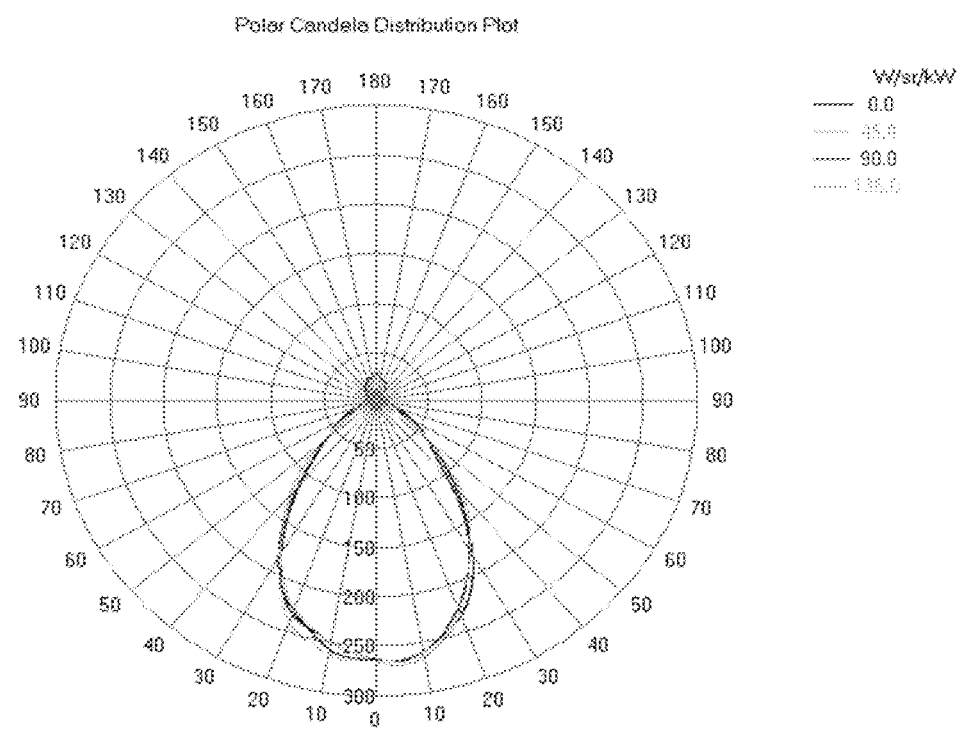
Figure 7D:
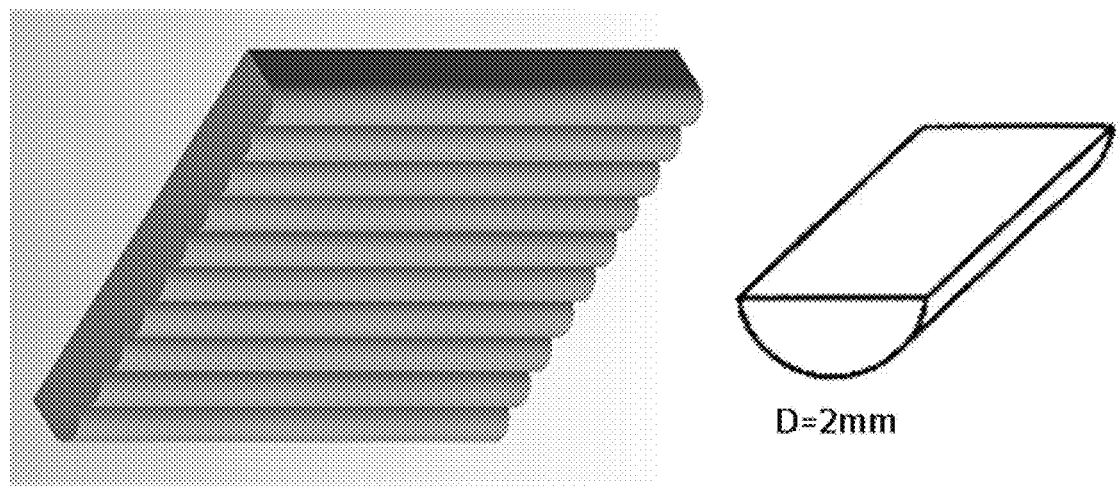
Figure 7D:
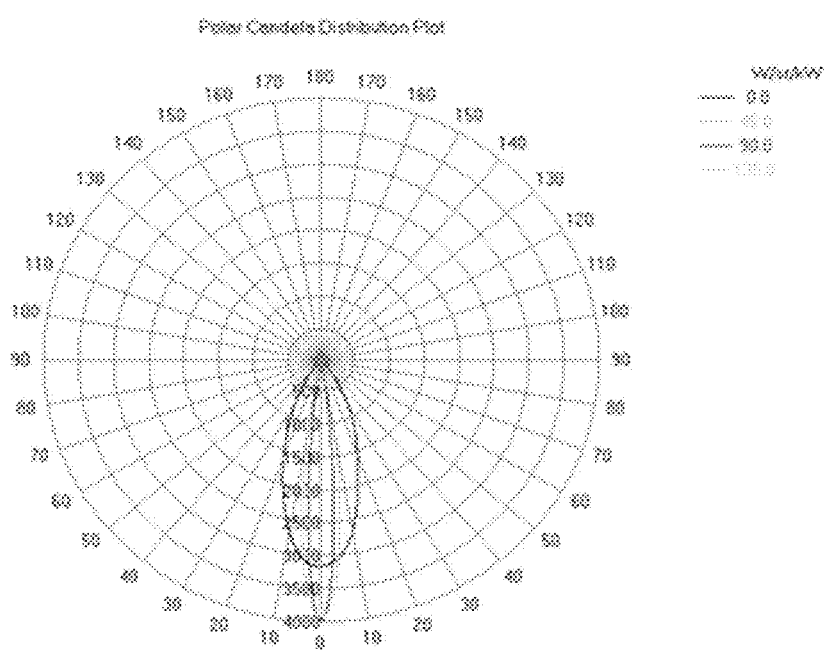
Figure 7E:
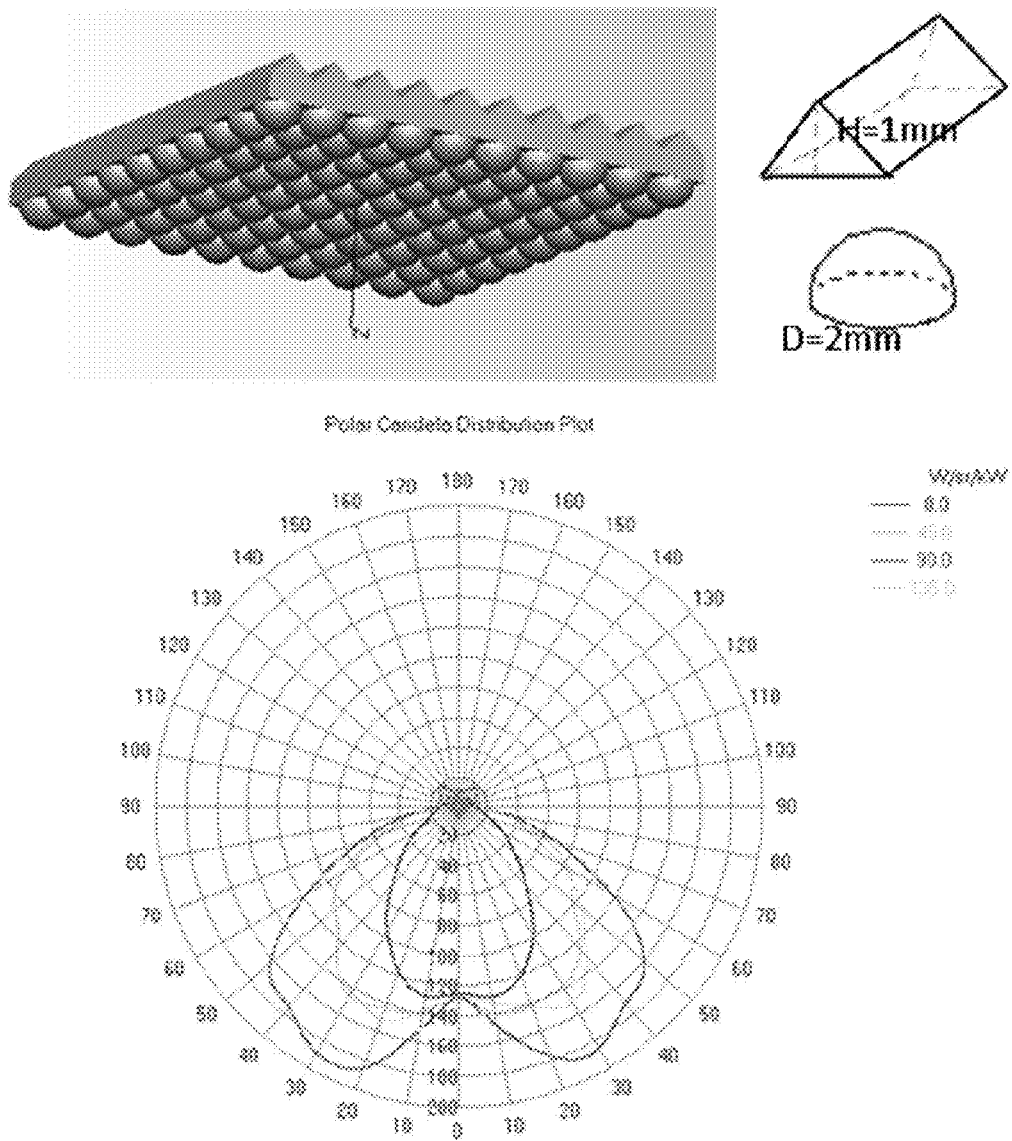

Now referring to FIGS. 7a-7e, different shapes of the light conversion film 101 with change in the emission angle and light shape is illustrated, in accordance with an embodiment of the present application. For example, in FIG. 7a, the light source is circular and scattered in ordinary positron emission tomography (PET). By changing to the PET with different shapes, the light shape can be controlled. If a conical pattern is used as shown in FIG. 7b, the light shape can be converged to enhance the intensity at the middle. Further, as shown in FIGS. 7c and 7d, both the hemispherical and semi-cylindrical patterns can play an intermediate converging effect on the light shape, thereby limiting the emission angle. The pattern of rectangular shape of incident surfaces and hemispherical emission surfaces give a bat-like light shape which makes the light intensity distribution of the illuminated surface more uniform. This can be adjusted and adapted to different planting environments and locations. Compared with a single PET diffusion film, the light conversion film 101 of the present application can change and adjust the LED emission light shape, enhance the uniformity of the light spectrum, achieve precise control of light shape by controlling the pattern of the diffusion film, improve the growth efficiency of the plant, and facilitate the aesthetic design of planting and the flexibility of planting.

Now referring back to FIG. 1a and 1b, the light control device 100 further comprise a growth monitoring unit (not shown in Figure). The growth monitoring unit may be configured to monitor size and height of the plants under observation. The light control device 100 further comprises a determining unit (not shown in Figure) to determine plant growth stage based on the size and the height of the plants. According to an embodiment, the growth monitoring unit and the determining unit may be a dedicated hardware, of the light control device, for example a processor or a microcontroller or application-specific integrated circuit (ASIC) used for performing various operations of the light control device.

Once the plant growth stage of the plants is determined, the motor 104 rotates the film switching unit 103 in such a manner that a light conversion film 101, associated with the plant growth stage of the plants, is positioned in front of the light source 102. Such positioning enables the light emitted from the light source 102 to pass through the light conversion film 101 and falls on the plants with a light spectrum required for stimulating the plant growth. The light source 102 used in present invention may be a conventional light source used in grow light system for greenhouse cultivation, vertical agriculture, and other indoor or outdoor farming systems.

According to an embodiment of present application, the light control device 100 is preferably a LED plant grow light, and more preferably a blue LED plant grow light. When the light conversion film 101 is applied in the LED plant grow light, the light conversion film 101 is preferably packaged away from LED light source and is thermally isolated by the air layer to improve the service life of the QD or the phosphor. More preferably, the light conversion film 101 is disposed outside the light emitting surface of the LED light source and has a distance of 2-3 cm from the surface of the LED light source.

Figure 5:
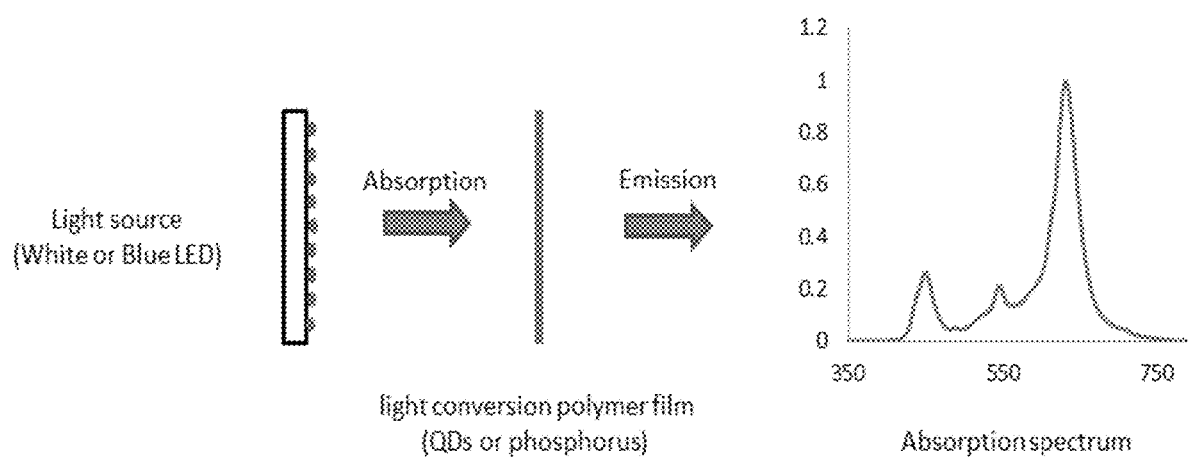
FIG. 5 illustrates a light conversion process of a light conversion film, in accordance with an embodiment of the present application.

Now referring to FIG. 5, the light conversion process of the light conversion film, in accordance with an embodiment of the present application is illustrated. The light conversion film 101 absorbs the energy of photons emitted by the white or blue LED light source and re-emits light of different colors according to the size of the quantum dots or the type of the micro-nano phosphor.

Figure 6A:
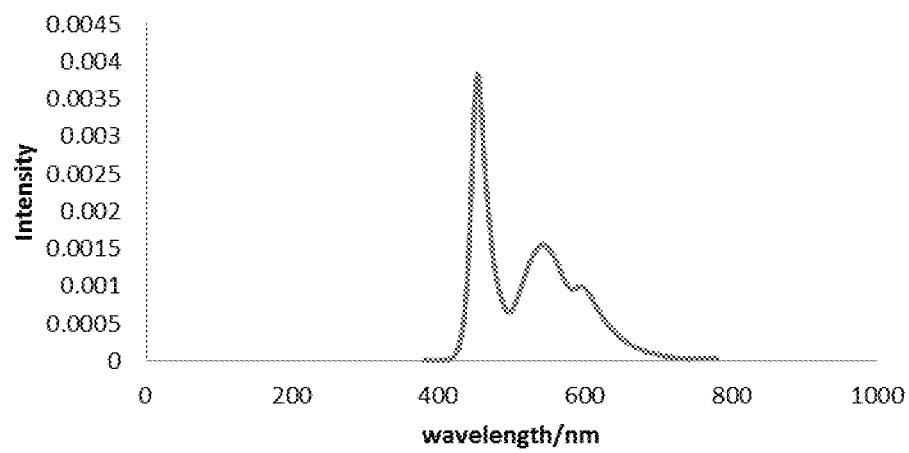
FIGS. 6a and 6b illustrate respectively emission spectra obtained by irradiating the light conversion film with a white LED and a blue LED light source, in accordance with an embodiment of the present application.
Figure 6B:
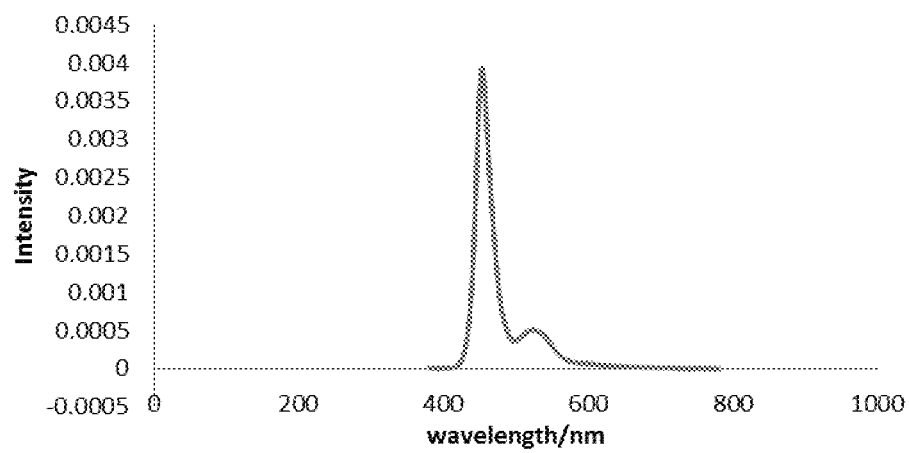

Now referring to FIGS. 6a and 6b, emission spectra obtained by irradiating the light conversion film 101 with a white LED and a blue LED light source, is illustrated in accordance with an embodiment of the present application. It can be seen from FIGS. 6a and 6b that the light emitted through the light conversion film 101 has a uniform emission spectrum, thereby avoiding the problem of spot and spectral unevenness caused by the point light source.

The light conversion film 101 has an energy down-conversion function and can convert light from high energy (shorter wavelength) to low energy (longer wavelength) when applied. When the light conversion film 101 is applied, change of light spectrum can be realized, and specifically, the light conversion film 101 can be switched automatically according to growth stage of the plant growth cycle. In this way, only a single type of LED setting can be used to switch and adjust the spectrum to meet various needs. The tunable spectrum is suitable or advantageous for different plant growth stages, such as seeding, vegetation, flowering, and fruiting or intended for specific growth applications.

In one exemplary embodiment, a light control device 100 comprises a blue LED lamp and the above-described light conversion film 101 disposed outside the light-emitting surface of the blue LED lamp. The blue LED lamp preferably has an emission spectrum peak at 400-470 nm for driving the light conversion film 101. One of the advantages of using the LED as a growth lamp is that, it can save at least half of the cost of lighting electricity and increase the commercial value of vegetables. The light control device 100 may further include a light guide plate to generate a planar light source, the light guide plate being disposed on both sides of the LED lamp and the light conversion film 101.

In another embodiment, the light conversion film 101 can be replaced manually or automatically at different time periods according to the plant growth cycle, so that the spectrum of the light source can be switched at different growth stages of a plant. Therefore, for a particular species of the plant, the growth spectrum can be preset to be more targeted to plant growth.

When the spectrum of the light source can be switched, there is no need to move vegetables from one growth rack to another growth rack, which greatly saves labor costs. Conventional grow lights systems require a combination of at least blue and red LED lights to achieve the desired spectrum. The spectrum can only be switched by changing the LED fixture or controlling the use of different LED chips. The present application only needs to replace the light conversion film 101 outside the blue LED light source, and the light source 101 itself does not need to be replaced, which greatly simplifies the operation.

As discussed above, the light conversion film 101 has uniformly distributed quantum dots and/or phosphors. The spectrum produced by the light conversion film 101 is much more uniform at different illumination positions of the plant as compared with a growth lamp using only the combination of red, blue, and white LEDs.

Figure 11:
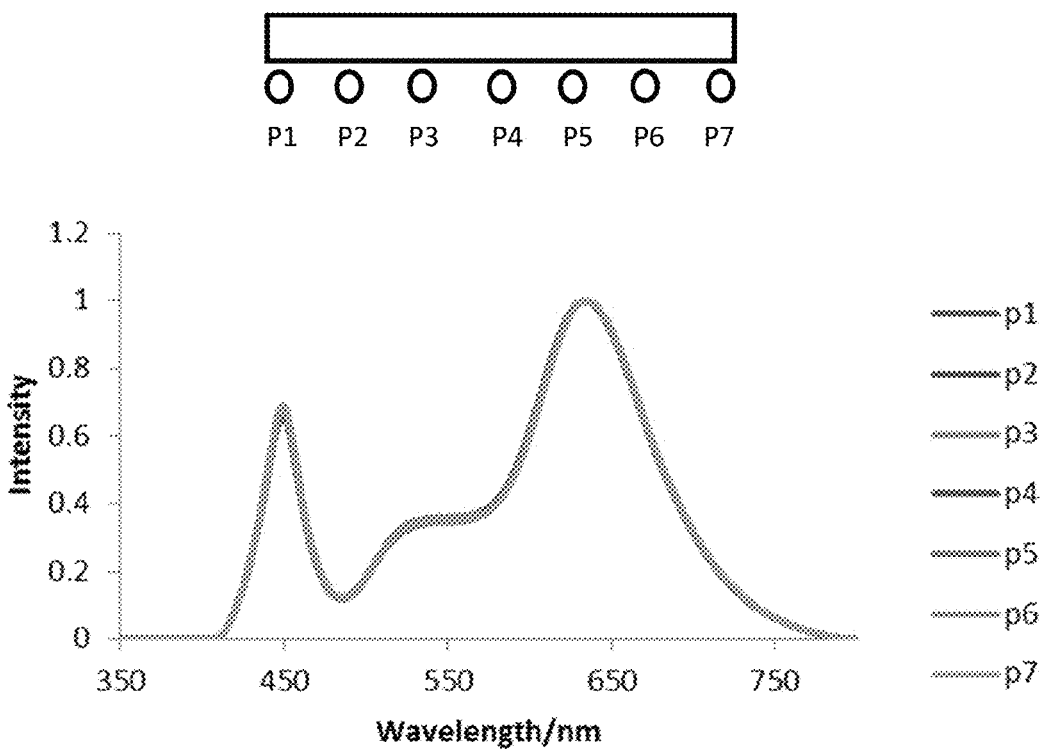
FIG. 11 illustrates emission spectra of the light control device at seven different locations, in accordance with an embodiment of the present application.

The spectral uniformity of the emission of the light control device 100 of the present application at different locations is tested. Specifically, the emission spectra at seven different locations 30 cm below the blue LED strip lamp is measured. The results are shown in FIG. 11. It can be seen that the spectra obtained at seven different locations are extremely uniform.

Now referring to FIGS. 2a-2d, a schematic diagram of a perspective view, an axial cross-sectional view, a radial longitudinal sectional view, and an axial longitudinal sectional view of an axial automatic the light control device 100, is illustrated in accordance with the embodiment of the present application. The light control device 100 comprises a blue LED strip lamp 102 and six strip-shaped light conversion films 101-1, 101-2, 101-3, 101-4, 101-5, 101-6 disposed outside the light emitting surface of the blue LED strip lamp 102 (i.e., light source). The six light conversion films 101-1, 101-2, 101-3, 101-4, 101-5, 101-6 are disposed on the outside of the blue LED strip lamp 102, and the distance from the surface of the blue LED strip lamp 102 is about 2-3 cm. The six light conversion films 101-1, 101-2, 101-3, 101-4, 101-5, 101-6 are attached and fixed on a drum-shaped rotary film switching unit 103. A roller (not shown in the Figure) of the film switching unit 103 can be rotated along the long axis direction, so that the changing of the light conversion film 101 can be realized by rotating the roller. As discussed above. the light control device 100 further includes the motor 104 for driving the drum-shaped rotary film switching unit 103 to effect automatic switching of the light conversion films 101-1 to 101-6 to obtain the desired light spectrum.

In one exemplary embodiment, the light conversion film 101-1 is used for seeding, the light conversion film 101-2 is used for plant growth, the light conversion films 101-3 and 101-4 are used for plant flowering, and the light conversion films 101-5 and 101-6 are used for fruit growth. Whereas, the blue LED lamp has emission peaks at 400-470 nm for driving the light conversion films 101-1 to 101-6.

At the initial growth stage, the light conversion film 101-1 is used for seeding stage of the plants. As the plants grows according to their development stage, the growth monitoring unit monitors the size and height of the plants. Based on the size and height, the determining unit determines the next growth stage of the plants. In one embodiment, each plant growth stage is assigned with a designated value or range of size and height. If the designed value or range of size and height is achieved, the determination unit determines the next growth stage and triggers switching of the light conversion film. In this case, the next growth stage may be determined as plant growth stage/vegetation stage. Thus, based on growth stage, the motor 104 is triggered to rotate the film switching unit 103 in such a manner that the light conversion film 101-2 associated with plant growth stage/vegetation stage positioned in front of the blue LED lamp. At this stage, the light conversion film 101-2 may remain for 2-4 weeks to complete the entire growth process. If the plant is able to flower (i.e., next growth stage), then based on determination of flowering stage, the light control device 100 may further rotate the film switching unit 103 in such a manner that the light conversion films 101-3 and 101-4 associated with the flowering stage of the plant are positioned in front of the blue LED lamp and provide a spectrum required for the flowering stage of the plants. After flowering stage, the plants may go through a fruiting stage. Based on the fruiting stage, the light control device 100 may again rotate the film switching unit 103 in such a manner that the light conversion films 101-5 and 101-6 associated with the fruiting stage of the plants are positioned in front of the blue LED lamp and provide a spectrum adapted or more suitable for fruiting growth.

The light conversion films 101 of above-mentioned light control device 100 are automatically switched according to a preset program. The preset program determines changes in the growth stage of the plants and accordingly performs switching of the light conversion films 101-1 to 101-6 to complete the entire growth process of the plants. Moreover, the light conversion films 101 are also changeable, so that certain specific types of plants can also be grown by a specific growth spectrum.

Figure 4A:
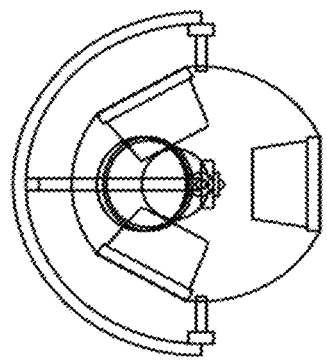
FIGS. 4a, 4b and 4c illustrate a schematic diagram of the spherical light control device with four and five light conversion films, in accordance with an embodiment of the present application.
Figure 4B:
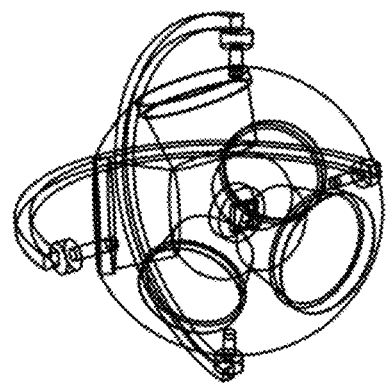
Figure 4C:
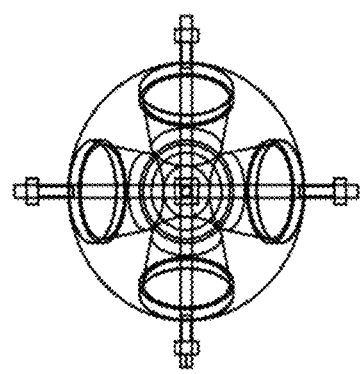

Now referring to FIGS. 3a-3d, a schematic diagram of a perspective view, a left side view, a front view, and a rear view, of an automatic spherical light control device is illustrated. The light control device 100 may comprise a blue LED strip lamp and three circular shape light conversion films 101-1, 101-2 and 101-3 respectively disposed outside the light emitting surface of the blue LED strip lamp. Three light conversion films 101-1, 101-2 and 101-3 are attached and fixed on a spherical rotary film switching unit that can rotate in both axial and radial directions. The light control device 100 further includes a motor for driving the spherical rotary film switching unit to realize automatic switching of the light conversion films 101-1, 101-2, and 101-3 to obtain a desired light spectrum. Similarly, FIGS. 4a-4c illustrates a schematic diagram of an automatic spherical light control device with four light conversion films and five light conversion films is illustrated. It must be understood to the skilled person, that there may be any number of light conversion films may be used in the present invention.

Figure 12:
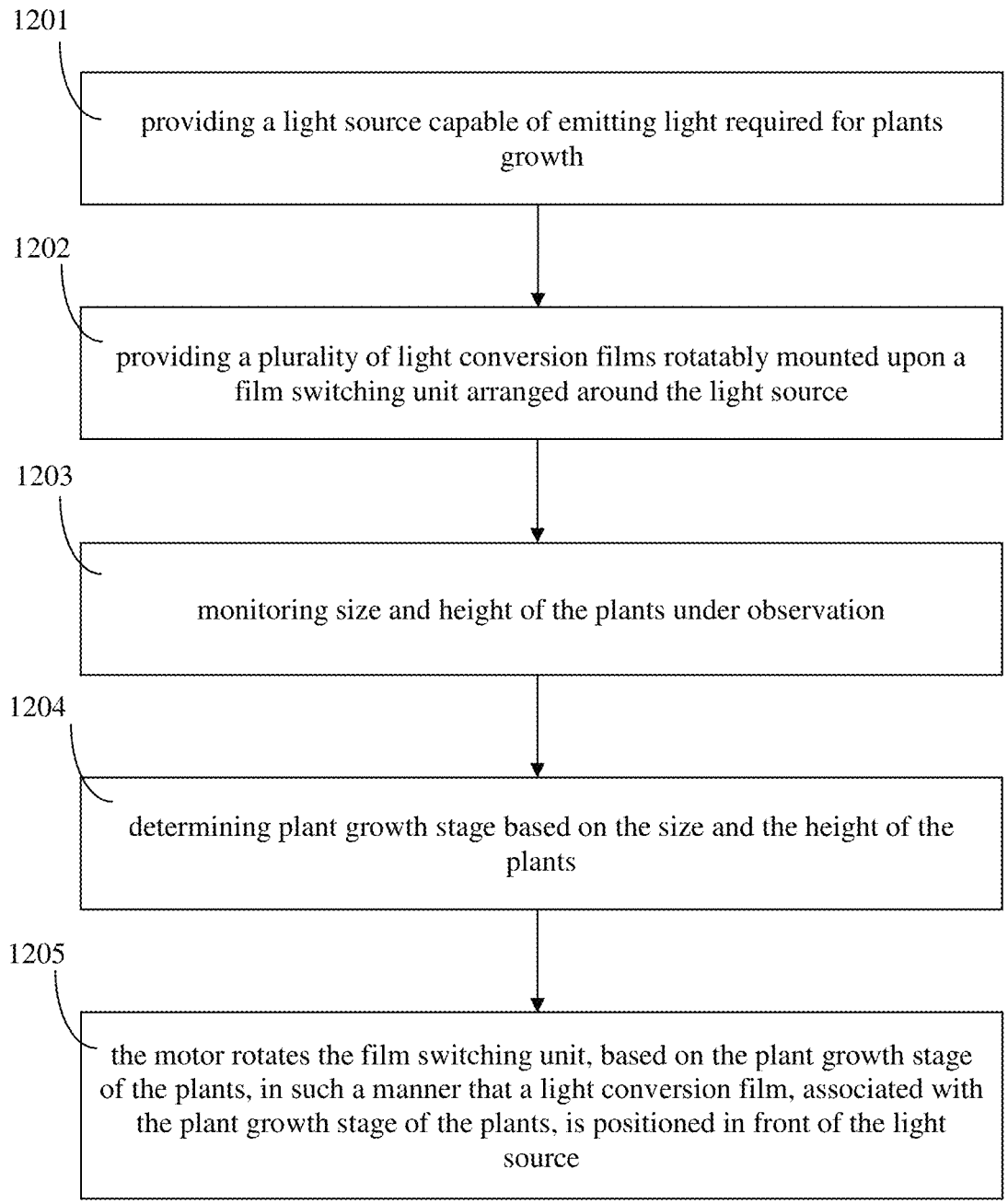
FIG. 12 illustrates a method for stimulating plant growth, in accordance with an embodiment of the present application.

Now referring to FIG. 12 a method for stimulating plant growth is illustrated, in accordance with an embodiment of the present application.

At block 1201, light source 102 is provided which is capable of emitting light required for plant growth.

At block 1202, a plurality of light conversion films 101 are provided which are rotatably mounted upon a film switching unit 103 arranged around the light source 102. The film switching unit 103 is driven by the motor 104 arranged therewithin. The plurality of light conversion films 101 provides the plurality of light spectra required during a plurality of plant growth stages.

At block 1203, size and height of the plants under observation are monitored using a growth monitoring unit.

At block 1204, plant growth stage is determined based on the size and the height of the plants using a determining unit.

At block 1205, the motor 104 may rotate the film switching unit 103, based on the plant growth stage of the plants, in such a manner that a light conversion film 101, associated with the plant growth stage of the plants, is positioned in front of the light source 102. Such positioning enables the light emitted from the light source 102 to pass through the light conversion film 101 and falls on the plants with a light spectrum required for stimulating the plant growth.

According to exemplary embodiment of the present application, the light control device 100 may be used to stimulate growth rate of below mentioned species:

Growing leafy vegetables: Green oakleaf lettuce, Green coral lettuce, Butterhead lettuce, herbs and etc.

Color changing species: Red oakleaf lettuce, Red coral lettuce, Red Sails Lettuce, Redina Lettuce, Galactic Lettuce and Benito Lettuce (species with high anthocyanin content)

Flowering and fruit growing species: Strawberries, Tomatoes

The detail explanation with experimental values of how the light control devices stimulates the plant growth based on different light spectra is provided here below.

Condition-1

Table 1 below indicates the condition-1 for different light spectra. For example, Philips™ T8 grow light, Spectrum-1, Spectrum-2 are used to study growth rate of the plants. Now referring to FIGS. 13a-13c, a reference spectrum of Philips™ T8 grow light, Spectrum-1 and Spectrum-2 of the light control device is illustrated, in accordance with an embodiment of the present application.

TABLE 1

Condition-1 for different light spectra (for growth rate study)

| Light | Measure distance (cm) | Photosynthetic photon flux density (PPFD) (umol/m$^2$/s) | Ech-A (W/m$^2$) | Ech-B (W/m$^2$) | Erb |
|---|---|---|---|---|---|
| Philips ™ T8 grow light | 20.0 | 113.0 | 3.4 | 4.2 | 0.9 |
| Spectrum-1 | 20.0 | 237.2 | 7.7 | 9.7 | 1.5 |
| Spectrum-2 | 20.0 | 235.1 | 12.6 | 10.5 | 4.5 |

Now, Table 2 below indicates light conditions A, B, and C used for condition-1 (for study in growth rate). It can be seen from the below Table 2 that, in condition A, the Philips™ T8 grow light is used for 33 days full growth cycles, Whereas, in condition B, it can be seen that, Spectrum-1 is used for 17 days (i.e., first-half of growth stage) and Spectrum-2 is used for 16 days (i.e., second-half of growth stage). Similarly, in Condition C, it can be seen that, Spectrum-2 is used for 17 days (i.e., first-half of growth cycle) and Spectrum-1 is used for 16 days (i.e., second-half of growth cycle).

TABLE 2

Light conditions for condition-1
Lighting conditions

| Condition A | Philips ™ T8 grow light (33 days full cycles) |
| Condition B | Spectrum-1 (17 days)→ Spectrum-2 (16 days) |
| Condition C | Spectrum-2 (17 days)→ Spectrum-1 (16 days) |

Table 3 below indicates different growth conditions for condition-1 study in growth rate.

TABLE 3

Different growth conditions for condition-1

| | Growth conditions |
|---|---|
| Germination days | 3-5 days* |
| Lighting days | 28-31 days |
| Lighting time | 12-16 hrs/day |
| Temperature | 20.5° C. |
| $CO_2$ | 800-1000 ppm |
| Nutrients    Temp | 20.5° C. |
|              EC | 2.00 |
|              pH | 6.10 |

*Depend on different species of vegetables

Scenario 1: In this scenario, we have compared the growth rate of following vegetable at above described condition-1.

Vegetable Species: Red Oakleaf Lettuce

TABLE 4

Results of lighting conditions

| | Lighting conditions | Avg. chlorophyll | Avg. weight/g | % of weight |
|---|---|---|---|---|
| 1-reference | Condition A | 20.1 | 66.7 | — |
| 2 | Condition B | 19.1 | 84.9 | +27.2% |
| 3 | Condition C | 18.5 | 76.0 | +13.9% |

TABLE 5

Results of Nutrient test

| | 1-reference | 2 | 3 |
|---|---|---|---|
| Ca (mg/100 g) | 28.4 | 19.8 | 26.2 |
| Fe (mg/100 g) | <0.5 | <0.5 | <0.5 |
| K (mg/100 g) | 345 | 320 | 311 |
| Total dietary fibre (g/100 g) | 1.4 | 1.6 | 1.5 |
| Vitamin C (mg/100 g) | 4 | 4 | 4 |

From the above Table 4, it can be seen that Philips™ T8 grow light is used as the reference spectrum. Conditions A, B and C were planted under the same condition, such as nutrients, temperature, humidity, $CO_2$ concentrations and the same batch of seeds in order to eliminate any experimental errors. Based on the study, it is found that condition B showed the highest percentage weight increase (27.2%) as compared with the reference sample (condition A) while condition C showed about 13.9% increase only. The test results indicate that there is an advantage in using Spectrum-1 in the $1^{st}$ half of the growth stage and using Spectrum-2 before harvest. However, using Spectrum-2 in the $1^{st}$ half of growth stage does not have many advantages in the final weight of the testing species. Referring to Tables 4 and 5, the average chlorophyll and nutrients content in the 3 testing conditions are all comparable to each other.

Scenario 2: In this scenario, we have compared the growth rate of following vegetable at above described condition-1.
Vegetable Species: Red Coral Lettuce

TABLE 6

Results of lighting conditions

| | Lighting conditions | Avg. chlorophyll | Avg. weight/g | % of weight |
|---|---|---|---|---|
| 1-ref | Condition A | 10.9 | 81.6 | — |
| 2 | Condition B | 12.2 | 108.9 | +33.4% |
| 3 | Condition C | 12.8 | 95.2 | +16.7% |

TABLE 7

Results of Nutrient test

| | 1-ref | 2 | 3 |
|---|---|---|---|
| Ca (mg/100 g) | 32.5 | 34.7 | 29.2 |
| Fe (mg/100 g) | <0.5 | <0.5 | <0.5 |
| K (mg/100 g) | 298 | 324 | 259 |
| Total dietary fibre (g/100 g) | 1.7 | 1.7 | 1.9 |
| Vitamin C (mg/100 g) | 3 | <2 | 2 |

Similar to scenario 1 (Red oakleaf lettuce), Table 6 illustrates a comparative study on the effect of light spectrum on growth rate for red coral lettuce. Under the same lighting condition, it was found that condition B also showed the best percentage of increase in weight as compared with condition C. Table 7 illustrates a nutrient test, which indicates that the results are all comparable to each other. From the above results, it can be seen that, using Spectrum-1 in the $1^{st}$ half of the growth stage and using Spectrum-2 before harvest showed the best condition in the study. Similar findings have also been found in green oakleaf lettuce (shown in Table 8) and green butterhead lettuce (shown in Table 9). The results are shown below in scenario 3 and scenario 4.

Scenario 3: In this scenario, we have compared the growth rate of following vegetable at above described condition-1.
Vegetable Species: Green Oakleaf Lettuce

TABLE 8

Results of lighting conditions

| | Lighting conditions | Avg. chlorophyll | Avg. weight/g | % of weight |
|---|---|---|---|---|
| 1-reference | Condition A | 24.7 | 105 | — |
| 2 | Condition B | 23.7 | 170 | +61.9% |
| 3 | Condition C | 26.4 | 155 | +47.6% |

Scenario 4: In this scenario, we have compared the growth rate of following vegetable at above described condition-1.
Vegetable Species: Green Butterhead Lettuce

TABLE 9

Results of lighting conditions

| | Lighting conditions | Avg. chlorophyll | Avg. weight/g | % of weight |
|---|---|---|---|---|
| 1-refenece | Condition A | 23.3 | 120.0 | — |
| 2 | Condition B | 35.5 | 183.0 | +52.5% |
| 3 | Condition C | 26.8 | 165.0 | +37.5% |

Condition-2

Now, Table 10 below indicates condition-2 for different light spectra. For example, Philips™ T8 grow light, Spectrum-1, Spectrum-2, and Spectrum-3 are used to study growth rate. Now referring to FIGS. 13a-13d, a reference spectrum of Philips™ T8 grow light, Spectrum-1, Spectrum-2, Spectrum-3 are illustrated, in accordance with an embodiment of the present application.

TABLE 10

Condition-2 for different light spectra (for growth rate study)

| Light | Measure distance (cm) | PPFD (umol/m²/s) | Ech-A (W/m²) | Ech-B (W/m²) | Erb |
|---|---|---|---|---|---|
| Philip T8 grow light | 20.0 | 113.0 | 3.4 | 4.2 | 0.9 |
| Spectrum-1 | 20.0 | 237.2 | 7.7 | 9.7 | 1.5 |
| Spectrum-2 | 20.0 | 235.1 | 12.6 | 10.5 | 4.5 |
| Spectrum-3 | 20.0 | 204.2 | 12.7 | 29.4 | — |

Now, Table 11 indicates light conditions A, B, D, E, F for condition-2 (study in growth rate). The below Condition A and Condition B are similar to Condition A and Condition B of the above described Table 2. However, in Condition D, the combination of Philips™ T8 grow light for 31 days and Spectrum-3 for 2 days is used. Further, in Condition E, it can be seen that, Spectrum-1 is used for 17 days, Spectrum-2 is used for 16 days, and Spectrum-3 is used for 2 days. Further, in Condition F, it can be seen that, Spectrum-2 is used for 17 days, Spectrum-1 is used for 16 days, and Spectrum-3 is used for 2 days.

TABLE 11

Light conditions for condition-2
Lighting conditions

| | |
|---|---|
| A | Philips ™ T8 grow light (33 days full cycle) |
| B | Spectrum-1 (17 days)→ Spectrum-2 (16 days) |
| D | Philips ™ T8 grow light (31 days)→ Spectrum-3 (2 days) |
| E | Spectrum-1 (17 days)→ Spectrum-2 (16 days) → Spectrum-3 (2 days) |
| F | Spectrum-2 (17 days)→ Spectrum-1 (16 days) → Spectrum-3 (2 days) |

Table 12 indicates different growth conditions for condition-2 (to study growth rate).

TABLE 12

Growth conditions for condition-2

| | | Growth conditions |
|---|---|---|
| Germination days | | 3-5 days* |
| Lighting days | | 28-31 days* |
| Lighting time | | 12-16 hrs/day |
| Temperature | | 20.5° C. |
| CO₂ | | 800-1000 ppm |
| Nutrients | Temp | 20.5° C. |
| | EC | 2.00 |
| | pH | 6.10 |

*Depend on different species of vegetables

Scenario 5: In this scenario, we have compared anthocyanin content by changing light spectrum at different growth stages for below vegetable.
Vegetable Species: Red Oak Leaf

TABLE 13

Result-1

| | Lighting condition | Anthocyanin content (nmol/g) | % of increase |
|---|---|---|---|
| 1-reference | A | 12.93 | — |
| 3 | D | 28.94 | +123.8% |

TABLE 14

Result-2

| | Lighting condition | Anthocyanin content (nmol/g) | % of increase |
|---|---|---|---|
| 2 | B | 9.50 | — |
| 4 | E | 14.6 | +53.7% |
| 5 | F | 15.1 | +58.9% |

Figure 14:
FIG. 14 illustrates a change in color from green to red after treatment of the Spectrum-3 for 2 days, in accordance with an embodiment of the present application.

Based on previous experimental result, an additional spectrum (Spectrum-3) was added to the plant species at a certain time period. Thus, lighting conditions (D, E and F) were used to study the anthocyanin content after Spectrum-3 treatments. Now referring to FIG. 14 and based on the findings in result-1 in the above Table 13, it can be seen that the condition D (an addition of Spectrum-3 for 2 days) have an increase in anthocyanin content by 123.8% and the color of the vegetable has changed from green to red due to the increase in anthocyanin content.

Another set of experiment was performed to confirm the test result (Result-2). Conditions E and F were performed, and it was found that the anthocyanin content is about 50% higher than the control condition B. Similar to result 1, the vegetables were changed from green to red, thus, the test results in the above Table 14 indicated that the addition of 2 days Spectrum-3 treatments will have an increase in anthocyanin content. The results also indicate that the increase in anthocyanin content is attributed to the use of Spectrum-3 which is independent to the growth spectrum used in different growing stages.

Figure 15A:
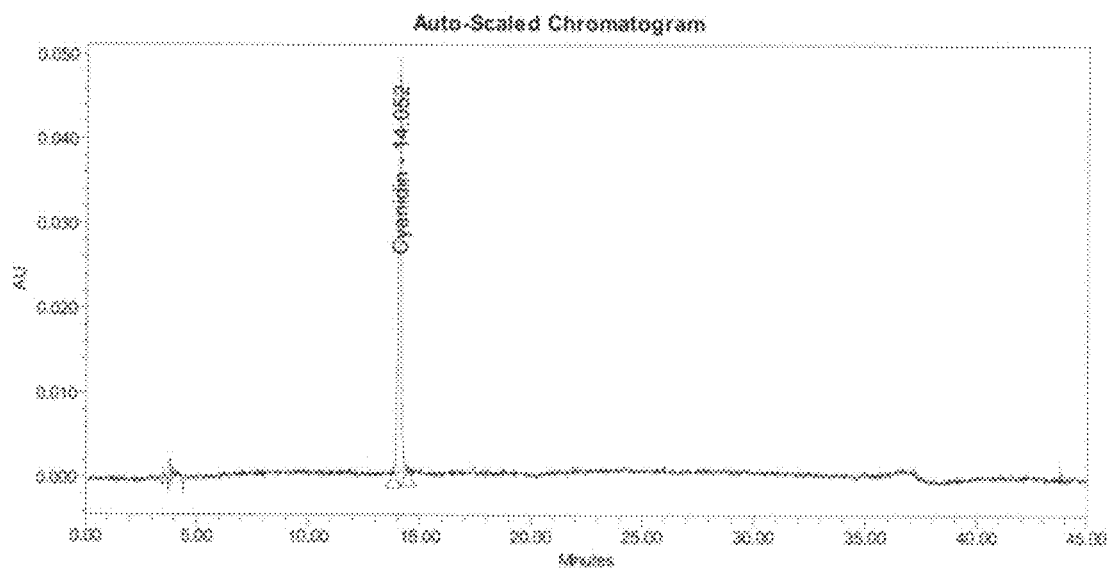
FIGS. 15a and 15b illustrate retention time of standard reference material i.e., Cyanidin a member of Anthocyanins and the anthocyanin extracted from plant leaf sample respectively, in accordance with an embodiment of the present application.
Figure 15B:
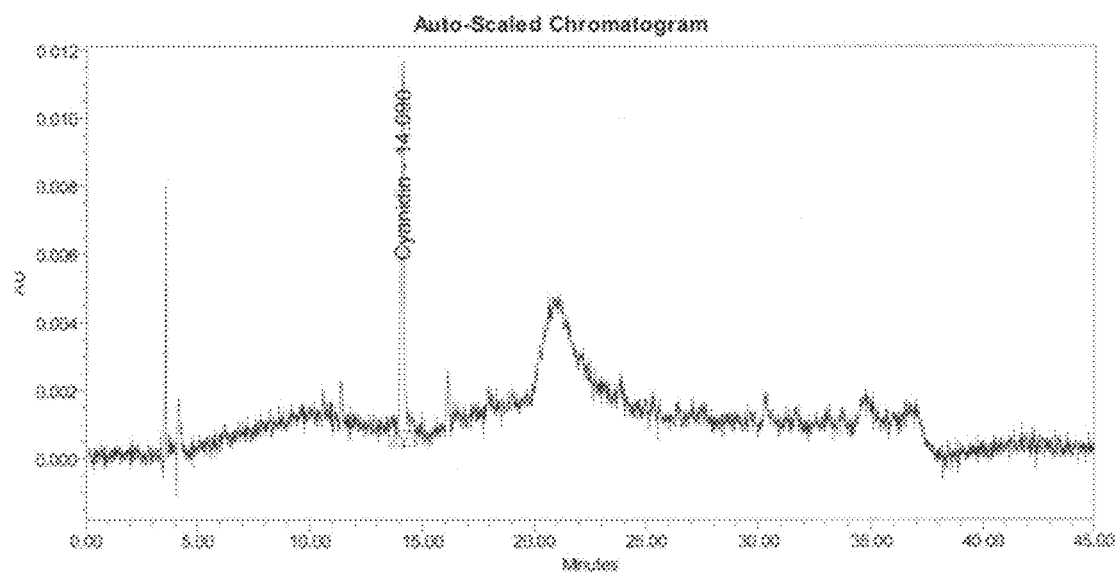

By changing the spectrum at a specific growth stage, the specific pigments generation in vegetables is excited, changing its color from green to red, which is comparable to cultivation under sunlight. The extracted red pigment from leaf is confirmed to be one kind of anthocyanins by HPLC-DAD. Now referring to FIGS. 15a-15b and Tables 15-18 below, it can be seen that the retention time (RT) of the sample pertaining to the present application (as shown in FIG. 15b and Tables 17-18) is the same as the reference standard material i.e., Cyanidin a member of Anthocyanins (shown in FIG. 15a and Tables 15-16), which indicate the extracted red pigment is anthocyanin.

TABLE 15

Peak results of reference standard material

| | Name | RT | Area | Height | Amount | Units |
|---|---|---|---|---|---|---|
| 1 | Cyanidin | 14.052 | 450968 | 47733 | | |

TABLE 16

PDA results table of reference standard material

| | Name | RT | Purity 1 Angle | Purity 1 Threshold | Match 1 Spect. Name | Match 1 Angle | Match 1 Threshold |
|---|---|---|---|---|---|---|---|
| 1 | Cyanidin | 14.052 | | | | | |

TABLE 17

Peak results of the sample pertaining to present application

| | Name | RT | Area | Height | Amount | Units |
|---|---|---|---|---|---|---|
| 1 | Cyanidin | 14.090 | 106557 | 10721 | | |

TABLE 18

PDA results table of the sample pertaining to present application

| | Name | RT | Purity 1 Angle | Purity 1 Threshold | Match 1 Spect. Name | Match 1 Angle | Match 1 Threshold |
|---|---|---|---|---|---|---|---|
| 1 | Cyanidin | 14.090 | | | | | |

Scenario 6: In this scenario, we have compared the amount of fruits by changing spectrum at different stages. The lighting conditions and growth conditions set are summarized in Tables 19 and 20.

Fruit Species: Tomatoes

TABLE 19

Lighting Conditions to compare the amount of fruits by changing spectrum at different stage

| | Lighting condition |
|---|---|
| A | Philips ™ T8 grow light (Full cycle) |
| H | Spectrum-1 (Leafing stage)→ Spectrum-2 (Flowering & Fruiting stages) |

TABLE 20

Growth conditions

| | | Growth conditions |
|---|---|---|
| Germination days | | 3 days |
| Lighting days | | 1-6 months* |
| Lighting time | | 14 hrs/day |
| Temperature | | 20.0-21.5° C. |
| $CO_2$ | | 800-1000 ppm |
| Nutrients | Temp | 20.0-21.5° C. |
| | EC | Stage 1 (Leafing: small size): 2.00 |
| | | Stage 2 (Leafing: bigger size): 2.50 |
| | | Stage 3 (Flowering): 3.00 |
| | pH | 6.10 |

*Depending on different tomato species of plant

For Small Tomato:

TABLE 21

Results (Total fruit collection period: 48 days)

| | Lighting conditions | Sweetness (Brix %) | No. of tomatoes (pcs) | Total weight/g | % of weight |
|---|---|---|---|---|---|
| 1-reference | Condition A | 7.36 | 12 | 22 | — |
| 2 | Condition H | 7.58 | 19 | 40 | +81.8% |

TABLE 22

Nutrient test results

| | 1-Reference | 2 |
|---|---|---|
| Vitamin C (mg/100 g) | 19 | 23 |
| Lycopene (mg/kg) | 312 | 291 |

Figure 16:
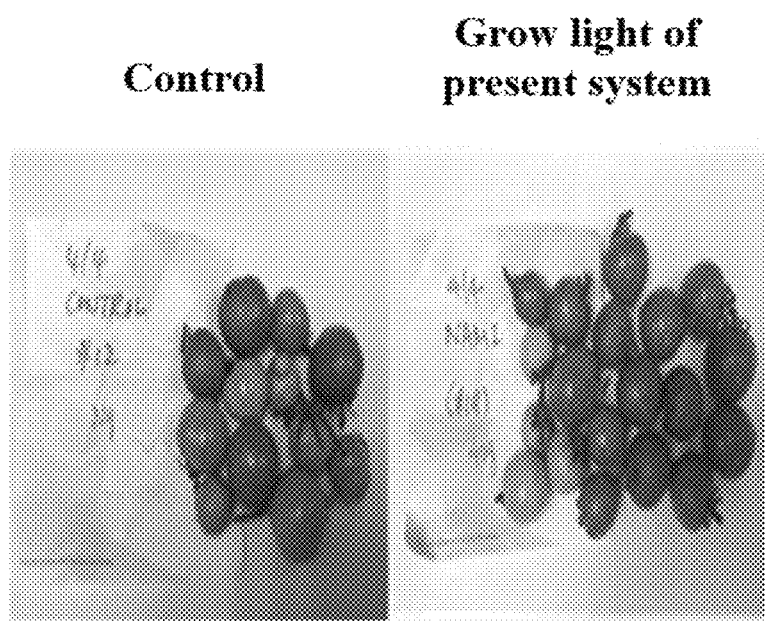
FIG. 16 illustrates a comparison of light conditions provided by Philips™ T8 grow light and proposed light control device on small tomato, in accordance with embodiment of the present application.

The changeable spectrum was also applied for planting tomato at different growth stages. The above Table 21 and FIG. 16 indicate the comparison of light condition H and the Philips™ T8 grow light. It can be observed that, light condition H showed a higher growth weight of tomatoes (Small tomato: +81.8%) and the sweetness of tomatoes remained unchanged. Besides, referring to Table 22, the nutrient tests indicated that the results are all comparable to each other.

According to embodiments of present application, the spectrum of the light control device is interchangeable. The interchangeable spectrum of the light control device for a specific time period initiates the generation of anthocyanin and improves the growth rate of the plant by 50%.

Although implementations for light control device and method have been described in language specific to structural features, it is to be understood that the appended claims are not necessarily limited to the specific features described. Rather, the specific features are disclosed as examples of implementations of the light control device for stimulating plant growth.

What is claimed is:

1. A light control device for stimulating plant growth, wherein the light control device comprises:
    a light source capable of emitting light required for plant growth;
    a plurality of light conversion films rotatably mounted upon a film switching unit arranged around the light source, wherein the film switching unit is driven by a motor arranged therewithin, and wherein the plurality of light conversion films provide a plurality of light spectra required during a plurality of plant growth stages;
    a growth monitoring unit configured to monitor size and height of plants under observation; and
    a determining unit to determine a plant growth stage based on the size and the height of the plants;
    wherein the motor rotates the film switching unit, based on the plant growth stage of the plants, in such a manner that a light conversion film, associated with the plant growth stage of the plants, is positioned in front of the light source, and wherein such positioning enables the light emitted from the light source to pass through the light conversion film and falls on the plants with a light spectrum required for stimulating the plant growth.

2. The light control device of claim 1, wherein the light conversion film comprises a light conversion material and a polymer carrier.

3. The light control device of claim 2, wherein the light conversion material comprises quantum dots (QDs), organic/inorganic phosphors, a combination of QD and phosphors organic light conversion molecules, or inorganic light conversion complexes.

4. The light control device of claim 2, wherein the light conversion material comprises at least one adhesive material selected from the group consisting of silicone, modified silicone, epoxy, modified epoxy, Poly(methyl methacrylate) (PMMA), and Polycarbonate (PC).

5. The light control device of claim 2, wherein the polymer carrier comprises a polymer nanofiber mat or a polymer film.

6. The light control device of claim 1, wherein the plurality of plant growth stages comprises at least one selected from the group consisting of seeding, vegetation, flowering and fruiting.

7. The light control device of claim 1, wherein the light source comprises one or more light emitting diodes (LEDs), wherein the LEDs emit light spectrum with peak value in the range of 400-470 nm in order to drive the light conversion film.

8. The light control device of claim 7, wherein light emitted from the light conversion film improves growth rate of plants by 50% and/or initiates generation of anthocyanin in plants.

9. The light control device of claim 1, further comprises a light guide plate to generate a planar light source, wherein the light guide plate is disposed on both sides of the light source and the light conversion film.

10. The light control device of claim 1, wherein the film switching unit comprises a drum-shaped rotary film switching unit or spherical rotary film switching unit.

11. A method for stimulating plant growth, wherein the method comprises:
providing a light source capable of emitting light required for plant growth;
providing a plurality of light conversion films rotatably mounted upon a film switching unit arranged around the light source, wherein the film switching unit is driven by a motor arranged therewithin, and wherein the plurality of light conversion films provide a plurality of light spectra required during a plurality of plant growth stages;
monitoring, by a growth monitoring unit, size and height of the plants under observation; and
determining, by a determining unit, a plant growth stage based on the size and the height of the plants;
wherein the motor rotates the film switching unit, based on the plant growth stage of the plants, in such a manner that a light conversion film, associated with the plant growth stage of the plants, is positioned in front of the light source, and wherein such positioning enables the light emitted from the light source to pass through the light conversion film and falls on the plants with a light spectrum required for stimulating the plant growth.

12. The method of claim 11, wherein the light conversion film comprises a light conversion material and a polymer carrier.

13. The method of claim 12, wherein the light conversion material comprises quantum dots (QDs), organic/inorganic phosphors, a combination of QD and phosphors organic light conversion molecules, or inorganic light conversion complexes.

14. The method of claim 12, wherein the light conversion material comprises at least one adhesive material selected from the group consisting of silicone, modified silicone, epoxy, modified epoxy, Poly(methyl methacrylate) (PMMA), and Polycarbonate (PC).

15. The method of claim 12, wherein the polymer carrier comprises a polymer nanofiber mat or a polymer film.

16. The method of claim 11, wherein the plurality of plant growth stages comprises at least one selected from the group consisting of seeding, vegetation, flowering and fruiting.

17. The method of claim 11, wherein the light source comprises one or more light emitting diodes (LEDs), wherein the LEDs emit light spectrum with peak value in the range of 400-470 nm in order to drive the light conversion film.

18. The method of claim 17, wherein light emitted from the light conversion film improves growth rate of plants by 50% and/or initiates generation of anthocyanin in plants.

19. The method of claim 11, further comprising providing a light guide plate to generate a planar light source, wherein the light guide plate is disposed on both sides of the light source and the light conversion film.

20. The method of claim 11, wherein the film switching unit comprises a drum-shaped rotary film switching unit or spherical rotary film switching unit.

* * * * *